(12) United States Patent
Dou et al.

(10) Patent No.: US 9,221,213 B2
(45) Date of Patent: Dec. 29, 2015

(54) MULTI-LAYER HIGH MOISTURE BARRIER POLYLACTIC ACID FILM

(75) Inventors: Shichen Dou, Warwick, RI (US); Tracy A. Paolilli, East Greenwich, RI (US); John J. Fitch, Middletown, RI (US); Michael F. Brandmeier, Narragansett, RI (US); Keunsuk P. Chang, North Kingstown, RI (US)

(73) Assignee: TORAY PLASTICS (AMERICA), INC., N. Kingstown, RI (US)

( * ) Notice: Subject to any disclaimer, the term of this patent is extended or adjusted under 35 U.S.C. 154(b) by 72 days.

(21) Appl. No.: 13/030,392

(22) Filed: Feb. 18, 2011

(65) Prior Publication Data

US 2011/0171489 A1 Jul. 14, 2011

Related U.S. Application Data

(63) Continuation-in-part of application No. 12/890,349, filed on Sep. 24, 2010, now Pat. No. 9,023,443.

(60) Provisional application No. 61/306,210, filed on Feb. 19, 2010, provisional application No. 61/246,048, filed on Sep. 25, 2009.

(51) Int. Cl.
*B32B 5/16* (2006.01)
*B32B 15/082* (2006.01)
(Continued)

(52) U.S. Cl.
CPC ............ *B29C 55/023* (2013.01); *B29C 55/143* (2013.01); *B32B 15/08* (2013.01); *B32B 15/20* (2013.01); *B32B 27/08* (2013.01); *B32B 27/32* (2013.01); *B32B 27/36* (2013.01); *B29K 2029/04* (2013.01); *B29K 2067/046* (2013.01); *B29K 2995/006* (2013.01); *B29K 2995/0067* (2013.01); *B32B 5/16* (2013.01); *B32B 15/082* (2013.01);
(Continued)

(58) Field of Classification Search
None
See application file for complete search history.

(56) References Cited

U.S. PATENT DOCUMENTS 4,189,419 A 2/1980 Takemoto et al.
4,281,045 A * 7/1981 Sumi et al. .................... 428/516
(Continued)

FOREIGN PATENT DOCUMENTS

CA 2239671 12/1999
DE 43 13 136 10/1994
(Continued)

OTHER PUBLICATIONS

International Search Report and Written Opinion mailed Jun. 3, 2011, directed to International Patent Application No. PCT/US11/25466; 9 pages.
(Continued)

*Primary Examiner* — Vivian Chen
(74) *Attorney, Agent, or Firm* — Morrison & Foerster LLP

(57) ABSTRACT

A laminate film including a first polylactic acid layer; a second metal-receiving layer including PVOH, EVOH, or a blend thereof on a side of the first polylactic acid layer; and a metal layer deposited on a side of the metal-receiving layer opposite the polylactic acid layer. The metal-receiving layer may be coextruded with the polylactic acid first layer or may be a coating applied to one side of the polylactic acid first layer. This laminate film exhibits excellent gas and moisture barrier properties, appearance, and metal adhesion. It may also include a heat sealable or winding improving layer on the side opposite the metal receiving-layer of the first polylactic acid layer.

19 Claims, 3 Drawing Sheets

(51) Int. Cl.

| | |
|---|---|
| *B32B 15/20* | (2006.01) |
| *B32B 27/18* | (2006.01) |
| *B32B 27/30* | (2006.01) |
| *B32B 27/36* | (2006.01) |
| *B32B 37/15* | (2006.01) |
| *C08L 23/08* | (2006.01) |
| *C08L 29/04* | (2006.01) |
| *C09D 123/08* | (2006.01) |
| *C09D 129/04* | (2006.01) |
| *C23C 14/14* | (2006.01) |
| *B29C 55/02* | (2006.01) |
| *B29C 55/14* | (2006.01) |
| *B32B 15/08* | (2006.01) |
| *B32B 27/08* | (2006.01) |
| *B32B 27/32* | (2006.01) |
| *C08K 3/00* | (2006.01) |
| *C08K 5/00* | (2006.01) |
| *B29K 29/00* | (2006.01) |
| *B29K 67/00* | (2006.01) |

(52) U.S. Cl.
CPC ............... *B32B 27/18* (2013.01); *B32B 27/30* (2013.01); *B32B 27/306* (2013.01); *B32B 37/153* (2013.01); *B32B 2250/03* (2013.01); *B32B 2255/10* (2013.01); *B32B 2255/205* (2013.01); *B32B 2307/518* (2013.01); *B32B 2307/7163* (2013.01); *B32B 2307/7246* (2013.01); *C08K 3/0025* (2013.01); *C08K 5/0033* (2013.01); *C08K 2201/018* (2013.01); *C08L 23/0861* (2013.01); *C08L 29/04* (2013.01); *C09D 123/0861* (2013.01); *C09D 129/04* (2013.01); *C23C 14/14* (2013.01); *Y10T 428/12549* (2015.01); *Y10T 428/1338* (2015.01); *Y10T 428/1341* (2015.01); *Y10T 428/1355* (2015.01); *Y10T 428/1359* (2015.01); *Y10T 428/1379* (2015.01); *Y10T 428/24851* (2015.01); *Y10T 428/24917* (2015.01); *Y10T 428/24975* (2015.01); *Y10T 428/265* (2015.01); *Y10T 428/266* (2015.01); *Y10T 428/269* (2015.01); *Y10T 428/31692* (2015.04); *Y10T 428/31797* (2015.04)

(56) References Cited

U.S. PATENT DOCUMENTS

| | | | |
|---|---|---|---|
| 4,310,578 A | | 1/1982 | Katsura et al. |
| 4,379,914 A | | 4/1983 | Lundberg |
| 4,410,595 A | | 10/1983 | Matsumoto et al. |
| 4,464,438 A | * | 8/1984 | Lu .................................. 428/516 |
| 4,632,959 A | | 12/1986 | Nagano |
| 4,745,171 A | | 5/1988 | Sato et al. |
| 4,828,920 A | | 5/1989 | Nakabayashi et al. |
| 4,877,685 A | | 10/1989 | Bergstrom et al. |
| 5,084,334 A | | 1/1992 | Hamano et al. |
| 5,108,807 A | * | 4/1992 | Tucker .......................... 428/35.2 |
| 5,147,726 A | | 9/1992 | Suzuki et al. |
| 5,153,074 A | | 10/1992 | Migliorini |
| 5,155,160 A | | 10/1992 | Yeh et al. |
| 5,175,054 A | | 12/1992 | Chu |
| 5,192,620 A | | 3/1993 | Chu et al. |
| 5,216,050 A | | 6/1993 | Sinclair |
| 5,352,716 A | * | 10/1994 | Chapman et al. ............. 523/128 |
| 5,359,026 A | | 10/1994 | Gruber |
| 5,391,423 A | | 2/1995 | Wnuk et al. |
| 5,443,780 A | | 8/1995 | Matsumoto et al. |
| 5,444,107 A | | 8/1995 | Ajioka et al. |
| 5,473,439 A | | 12/1995 | Pappas |
| 5,484,881 A | | 1/1996 | Gruber et al. |
| 5,489,474 A | | 2/1996 | Shinoda et al. |
| 5,556,711 A | | 9/1996 | Ajioka et al. |
| 5,585,191 A | | 12/1996 | Gruber et al. |
| 5,631,066 A | | 5/1997 | O'Brien |
| 5,631,498 A | | 5/1997 | Anschel et al. |
| 5,731,093 A | | 3/1998 | Chang et al. |
| 5,849,374 A | | 12/1998 | Gruber et al. |
| 5,849,401 A | | 12/1998 | El-Afandi et al. |
| 5,908,918 A | | 6/1999 | Chen et al. |
| 5,939,467 A | | 8/1999 | Wnuk et al. |
| 6,005,068 A | | 12/1999 | Gruber et al. |
| 6,033,747 A | | 3/2000 | Shiotani |
| 6,080,478 A | | 6/2000 | Karhuketo |
| 6,096,431 A | | 8/2000 | Matsudaira et al. |
| 6,106,950 A | | 8/2000 | Searle et al. |
| 6,121,410 A | | 9/2000 | Gruber et al. |
| 6,143,408 A | | 11/2000 | Fujita |
| 6,153,276 A | * | 11/2000 | Oya et al. ...................... 428/35.2 |
| 6,171,714 B1 | | 1/2001 | Bergkessel et al. |
| 6,211,290 B1 | | 4/2001 | Xiao et al. |
| 6,248,430 B1 | | 6/2001 | Toyoda et al. |
| 6,312,823 B1 | | 11/2001 | El-Afandi et al. |
| 6,322,899 B1 | | 11/2001 | Karhuketo et al. |
| 6,326,440 B1 | | 12/2001 | Terada et al. |
| 6,350,530 B1 | | 2/2002 | Morikawa et al. |
| 6,353,086 B1 | | 3/2002 | Kolstad et al. |
| 6,444,750 B1 | | 9/2002 | Touhsaent |
| 6,472,081 B1 | | 10/2002 | Tsai et al. |
| 6,500,556 B1 | | 12/2002 | Morris et al. |
| 6,514,602 B1 | | 2/2003 | Zhao et al. |
| 6,521,336 B2 | | 2/2003 | Narita et al. |
| 6,543,208 B1 | | 4/2003 | Kobayashi et al. |
| 6,544,369 B1 | | 4/2003 | Kitamura et al. |
| 6,566,426 B1 | | 5/2003 | Kanaida et al. |
| 6,600,008 B1 | | 7/2003 | Kobayashi et al. |
| 6,649,103 B1 | | 11/2003 | Bousmina |
| 6,649,732 B2 | | 11/2003 | Kobayashi et al. |
| 6,713,175 B1 | | 3/2004 | Terada et al. |
| 6,787,245 B1 | | 9/2004 | Hayes |
| 6,808,795 B2 | | 10/2004 | Noda et al. |
| 6,821,373 B1 | | 11/2004 | Berlin et al. |
| 6,841,597 B2 | | 1/2005 | Bastioli et al. |
| 6,844,077 B2 | * | 1/2005 | Squier et al. .................. 428/457 |
| 7,067,596 B2 | | 6/2006 | Bastioli et al. |
| 7,070,803 B2 | | 7/2006 | Skinhoj et al. |
| 7,087,313 B2 | | 8/2006 | Sawai et al. |
| 7,112,356 B2 | | 9/2006 | Nomula et al. |
| 7,128,969 B2 | | 10/2006 | Busch et al. |
| 7,173,080 B2 | | 2/2007 | Yamada et al. |
| 7,175,917 B2 | | 2/2007 | Sukigara et al. |
| 7,195,822 B2 | | 3/2007 | Hiruma |
| 7,214,414 B2 | | 5/2007 | Khemani et al. |
| 7,223,359 B2 | | 5/2007 | Torkelson et al. |
| 7,235,287 B2 | | 6/2007 | Egawa |
| 7,285,318 B2 | | 10/2007 | Kaku et al. |
| 7,316,848 B2 | | 1/2008 | Longmoore |
| 7,320,773 B2 | | 1/2008 | Egawa |
| 7,351,772 B2 | | 4/2008 | Yano et al. |
| 7,351,785 B2 | | 4/2008 | Matsumoto et al. |
| 7,354,973 B2 | | 4/2008 | Flexman |
| 7,368,160 B2 | | 5/2008 | Inglis |
| 7,368,496 B2 | * | 5/2008 | Kim et al. ...................... 524/445 |
| 7,390,543 B2 | | 6/2008 | Itoh et al. |
| 7,390,558 B2 | | 6/2008 | Aritake et al. |
| 7,449,510 B2 | | 11/2008 | Ueda et al. |
| 7,452,927 B2 | | 11/2008 | Hayes |
| 7,491,359 B2 | * | 2/2009 | Bourgeois ...................... 264/513 |
| 7,501,176 B2 | | 3/2009 | Yamasaki et al. |
| 7,521,103 B2 | | 4/2009 | Posey |
| 7,566,753 B2 | * | 7/2009 | Randall et al. ................. 525/190 |
| 7,589,151 B2 | | 9/2009 | Aoki et al. |
| 7,619,025 B2 | | 11/2009 | Mohanty et al. |
| 7,678,444 B2 | | 3/2010 | Tedford, Jr. et al. |
| 7,713,636 B2 | | 5/2010 | Song et al. |
| 7,714,048 B2 | | 5/2010 | Goino et al. |
| 7,786,210 B2 | | 8/2010 | Uradnisheck et al. |
| 7,799,399 B2 | * | 9/2010 | Sargeant et al. ............... 428/35.9 |
| 7,820,276 B2 | | 10/2010 | Sukigara et al. |
| 7,834,092 B2 | | 11/2010 | Uradnisheck et al. |
| 7,847,184 B2 | | 12/2010 | Hayes et al. |

(56) References Cited

U.S. PATENT DOCUMENTS

| | | | |
|---|---|---|---|
| 7,854,994 B2* | 12/2010 | Henderson-Rutgers et al. | 428/480 |
| 7,943,218 B2* | 5/2011 | Knoerzer et al. | 428/35.4 |
| 7,951,438 B2* | 5/2011 | Lee et al. | 428/35.8 |
| 7,993,745 B2 | 8/2011 | Narita et al. | |
| 8,003,731 B2 | 8/2011 | Seeliger et al. | |
| 8,043,674 B2 | 10/2011 | Rehkugler et al. | |
| 8,053,219 B2 | 11/2011 | Kang et al. | |
| 8,062,721 B2 | 11/2011 | Kawahara et al. | |
| 8,080,297 B2* | 12/2011 | Kravitz et al. | 428/36.6 |
| 8,252,421 B2* | 8/2012 | Arai et al. | 428/423.1 |
| 8,450,420 B2 | 5/2013 | Sakurai | |
| 2001/0031348 A1 | 10/2001 | Jud et al. | |
| 2002/0006485 A1 | 1/2002 | Bening et al. | |
| 2002/0028857 A1 | 3/2002 | Holy | |
| 2002/0076554 A1 | 6/2002 | Stopper | |
| 2002/0086940 A1 | 7/2002 | Ota et al. | |
| 2002/0094444 A1 | 7/2002 | Nakata et al. | |
| 2002/0127358 A1 | 9/2002 | Berlin et al. | |
| 2003/0039775 A1 | 2/2003 | Kong | |
| 2003/0175545 A1 | 9/2003 | Kastner et al. | |
| 2003/0199218 A1 | 10/2003 | Mueller et al. | |
| 2004/0053064 A1 | 3/2004 | Masuda et al. | |
| 2004/0096677 A1 | 5/2004 | Imai et al. | |
| 2004/0185282 A1 | 9/2004 | Rosenbaum et al. | |
| 2004/0191541 A1 | 9/2004 | Squier et al. | |
| 2004/0258857 A1 | 12/2004 | Dagan et al. | |
| 2005/0098928 A1 | 5/2005 | Rosenbaum et al. | |
| 2005/0131120 A1 | 6/2005 | Flexman | |
| 2005/0186414 A1 | 8/2005 | Su et al. | |
| 2005/0250931 A1 | 11/2005 | Takagi | |
| 2005/0287358 A1 | 12/2005 | Inglis | |
| 2006/0009611 A1 | 1/2006 | Hayes | |
| 2006/0019111 A1 | 1/2006 | Sawai et al. | |
| 2006/0068200 A1 | 3/2006 | Cleckner et al. | |
| 2006/0116471 A1 | 6/2006 | Aoyama et al. | |
| 2006/0135668 A1 | 6/2006 | Hayes | |
| 2006/0257585 A1 | 11/2006 | Schiller et al. | |
| 2006/0257676 A1 | 11/2006 | Itada et al. | |
| 2006/0269755 A1 | 11/2006 | Song | |
| 2007/0020448 A1 | 1/2007 | Hubbard et al. | |
| 2007/0032577 A1 | 2/2007 | Kanzawa et al. | |
| 2007/0036923 A1 | 2/2007 | Ishizaki et al. | |
| 2007/0054070 A1 | 3/2007 | Laney et al. | |
| 2007/0087131 A1 | 4/2007 | Hutchinson et al. | |
| 2007/0098966 A1 | 5/2007 | Zhou | |
| 2007/0141372 A1 | 6/2007 | Su et al. | |
| 2007/0179218 A1 | 8/2007 | Brake et al. | |
| 2007/0182041 A1 | 8/2007 | Rizk et al. | |
| 2007/0254160 A1 | 11/2007 | Kravitz et al. | |
| 2007/0259139 A1 | 11/2007 | Furneaux | |
| 2008/0027178 A1 | 1/2008 | Uradnisheck | |
| 2008/0160327 A1 | 7/2008 | Knoerzer et al. | |
| 2008/0188154 A1 | 8/2008 | Leis et al. | |
| 2008/0311813 A1 | 12/2008 | Ting et al. | |
| 2009/0022919 A1* | 1/2009 | Chicarella et al. | 428/35.9 |
| 2009/0053489 A1 | 2/2009 | Yamamura et al. | |
| 2009/0098375 A1 | 4/2009 | Voisin et al. | |
| 2009/0098395 A1 | 4/2009 | Lu | |
| 2009/0148713 A1* | 6/2009 | Lee et al. | 428/458 |
| 2009/0148715 A1 | 6/2009 | Lee | |
| 2009/0169844 A1 | 7/2009 | Yamamura et al. | |
| 2009/0171065 A1 | 7/2009 | Nakamura et al. | |
| 2009/0263600 A1 | 10/2009 | Miyashita et al. | |
| 2009/0263654 A1 | 10/2009 | Arai et al. | |
| 2009/0286090 A1 | 11/2009 | Ting et al. | |
| 2009/0311544 A1 | 12/2009 | Lee et al. | |
| 2009/0312462 A1* | 12/2009 | Oakley et al. | 524/47 |
| 2010/0009208 A1 | 1/2010 | Lee | |
| 2010/0040904 A1* | 2/2010 | Cloutier et al. | 428/626 |
| 2010/0092791 A1 | 4/2010 | Busch et al. | |
| 2010/0151167 A1 | 6/2010 | Gohil | |
| 2010/0247886 A1 | 9/2010 | Lee et al. | |
| 2010/0323196 A1 | 12/2010 | Dou et al. | |
| 2010/0330382 A1 | 12/2010 | Dou et al. | |
| 2011/0028622 A1 | 2/2011 | Uradnisheck | |
| 2011/0046254 A1 | 2/2011 | Shin et al. | |
| 2011/0052867 A1 | 3/2011 | Yamamura et al. | |
| 2011/0076511 A1* | 3/2011 | Paolilli et al. | 428/614 |
| 2011/0244185 A1* | 10/2011 | Dou et al. | 428/156 |
| 2011/0244186 A1* | 10/2011 | Dou et al. | 428/156 |
| 2011/0244257 A1 | 10/2011 | Paulino et al. | |
| 2012/0088108 A1 | 4/2012 | Paolilli et al. | |
| 2012/0141766 A1 | 6/2012 | Paulino et al. | |
| 2013/0143057 A1 | 6/2013 | Paolilli et al. | |
| 2013/0143064 A1 | 6/2013 | Paolilli et al. | |

FOREIGN PATENT DOCUMENTS

| | | |
|---|---|---|
| EP | 1 385 700 | 7/2005 |
| EP | 1 619 021 | 1/2006 |
| EP | 1 385 899 | 2/2007 |
| EP | 1 839 849 | 10/2007 |
| EP | 1 942 001 | 7/2008 |
| EP | 1 955 845 | 8/2008 |
| EP | 2 065 178 | 6/2009 |
| EP | 2 133 382 | 12/2009 |
| JP | 8-176329 | 7/1996 |
| JP | 2002-155207 | 5/2002 |
| JP | 2003-145677 | 5/2003 |
| JP | 2003-170560 | 6/2003 |
| JP | 2003-276144 | 9/2003 |
| JP | 2004-82512 | 3/2004 |
| JP | 2004-315586 | 11/2004 |
| JP | 2004-323592 | 11/2004 |
| JP | 2004-358721 | 12/2004 |
| JP | 2006-176758 | 7/2006 |
| JP | 2006-263892 | 10/2006 |
| JP | 2007-76192 | 3/2007 |
| JP | 2007-99952 | 4/2007 |
| JP | 2007-269995 | 10/2007 |
| JP | 2008-62591 | 3/2008 |
| JP | 2008-62984 | 3/2008 |
| KR | 10-2006-0099887 | 9/2006 |
| KR | 10-2007-0102005 | 10/2007 |
| WO | WO-94/17220 | 8/1994 |
| WO | WO-02/087877 | 11/2002 |
| WO | WO-02/088230 | 11/2002 |
| WO | WO-2004/016417 | 2/2004 |
| WO | WO-2004/060648 | 7/2004 |
| WO | WO-2004/087812 | 10/2004 |
| WO | WO-2004/094143 | 11/2004 |
| WO | WO-2004/101642 | 11/2004 |
| WO | WO-2005/053964 | 6/2005 |
| WO | WO-2005/059031 | 6/2005 |
| WO | WO-2007/046174 | 4/2007 |
| WO | WO-2007/118280 | 10/2007 |
| WO | WO-2008/020726 | 2/2008 |
| WO | WO-2008/035557 | 3/2008 |
| WO | WO-2009/076458 | 6/2009 |
| WO | WO-2009/076541 | 6/2009 |
| WO | WO-2009/084518 | 7/2009 |
| WO | WO-2009/142825 | 11/2009 |
| WO | WO-2009/152427 | 12/2009 |
| WO | WO-2010/019944 | 2/2010 |

OTHER PUBLICATIONS

International Search Report and Written Opinion mailed May 26, 2011, directed to International Patent Application No. PCT/US11/30784; 9 pages.

Biofilm S.A. promotional literature (presented at "Innovation Takes Root" by Nature Works, Las Vegas NV. Sep. 16-18, 2008).

TAPPI Conference Presentation, May 2003, "Adhesive Properties of Ethylene-Acrylic Ester-Maleic Anhydride Terpolymers in Extrusion Coating/Lamination"; (27 pages).

Product Literature Presentation, May 2005, "Lotader: Ultra Versatile Adhesives for Extrusion Coating and Extrusion Lamination Technologies"; (18 pages).

Jiang, et al., (Nov. 23, 2005). "Study of Biodegradable Polylactide/Poly(butylene adipateco-terephthalate) Blends," Biomacromolecules. 7(1):199-207.

(56) References Cited

OTHER PUBLICATIONS (2007) "Technology Focus Report: Toughened PLA," *NatureWorks* 1-5.
Priddy D. (2010)."Improving PLA mechanical properties by the addition of oil." *Polymer Engineering and Science* 50(3):513-519.
International Search Report and Written Opinion mailed on Feb. 6, 2009, directed to international Application No. PCT/US2008/86261; 8 pages.
International Search Report and Written Opinion mailed on Feb. 6, 2009, directed to International Patent Application No. PCT/US2008/86450; 5 pages.
International Search Report mailed on Oct. 1, 2009 directed at international application No. PCT/US2009/054022; 12 pages.
International Search Report and Written Opinion mailed on Aug. 17, 2010, directed to International Patent Application No. PCT/US10/38848; 11 pages.
International Search Report and Written Opinion mailed on Sep. 1, 2010, directed to International Patent Application No. PCT/US2010/040185; 10 pages.
Lee et al., U.S. Office Action mailed Jun. 25, 2009, directed to U.S. Appl. No. 12/332,153; 9 pages.
Lee et al., U.S. Office Action mailed on Dec. 23, 2009, directed at U.S. Appl. No. 12/332,153; 10 pages.
Lee et al., U.S. Office Action mailed on Apr. 12, 2010, directed at U.S. Appl. No. 12/332,153; 11 pages.
Lee et al., U.S. Office Action mailed on Sep. 28, 2010, directed at U.S. Appl. No. 12/332,153; 9 pages.
Shichen Dou et al., U.S. Appl. No. 61/218,846, filed Jun. 19, 2009; 13 pages.
Tracy A. Paolilli et al., U.S. Appl. No. 12/890,349, filed Sep. 24, 2010; 52 pages.
Shichen Dou et al., U.S. Appl. No. 12/977,647, filed Dec. 23, 2010; 59 pages.
Defosse, Matt. "Film extrusion: Bioplastic barrier film matches EVOH, PA," located at <http://www.plastictoday.com/print/31263> visited on Nov. 20, 2009. (1 page).
"Coextruded Film Structures of PLA and EVOH," presented at Tappi Place Conference, Albuquerque, New Mexico, Apr. 18-21, 2010; 31 pages.
Lee, U.S. Office Action mailed Sep. 27, 2011, directed to U.S. Appl. No. 12/333,047; 7 pages.
Cloutier et al., U.S. Office Action mailed Oct. 27, 2011 directed to U.S. Appl. No. 12/542,428; 13 pages.
Dou et al., U.S. Office Action mailed Aug. 20, 2012, directed to U.S. Appl. No. 12/824,759; 12 pages.
Dou et al., U.S. Office Action mailed Sep. 7, 2012, directed to U.S. Appl. No. 13/077,302; 12 pages.
International Search Report and Written Opinion, mailed Aug. 17, 2011, directed to International Patent Application No. PCT/US11/36453; 11 pages.
Wallach, J. et al., "Methacrylic Group Functionalized Poly(lactic acid) Macromonomers from Chemical Recycling of Poly(lactic acid)." Polymers from Renewable Resources ACS Symposium Series [online]. Jan. 15, 2001. Chapter 18, pp. 281-292: Retrieved from the Internet: URL:http://pubs.acs.org/doi/abs/10.1021/bk-2000-0764.ch018, Abstract only.
International Search Report and Written Opinion mailed Feb. 11, 2011, directed to International Patent Application No. PCT/US10/50227; 10 pages.
International Search Report and Written Opinion mailed Mar. 14, 2011, directed to International Patent Application No. PCT/US10/62062; 10 pages.
Dou, S. et al., U.S. Appl. No. 13/077,302, filed Mar. 31, 2011; 65 pages.
Cloutier et al., Office Action mailed Jun. 19, 2013, directed to U.S. Appl. No. 12/542,428; 10 pages.
Lee et al., Office Action mailed Sep. 20, 2012, directed to U.S. Appl. No. 12/731,925; 18 pages.
Lee et al., Office Action mailed Jun. 4, 2013, directed to U.S. Appl. No. 12/731,925; 18 pages.
Extended Search Report dated Nov. 6, 2012, directed to EP Application No. 08859113.6; 6 pages.
Paulino et al., U.S. Office Action mailed May 22, 2013, directed to U.S. Appl. No. 13/313,567; 9 pages.
Paulino et al., U.S. Office Action mailed Oct. 16, 2013, directed to U.S. Appl. No. 13/313,567; 8 pages.
Paulino et al., U.S. Office Action mailed Feb. 26, 2014, directed to U.S. Appl. No. 13/313,567; 15 pages.
Markarian, Jennifer. (May/Jun. 2008). "Biopolymers present new market opportunities for additives in packaging," *Plastics, Additives, and Compounding* 10(3): 22-25.
Paulino et al., U.S. Office Action mailed Aug. 5, 2013, directed to U.S. Appl. No. 13/107,149; 20 pages.
Paolilli et al., U.S. Office Action mailed Jul. 17, 2013, directed to U.S. Appl. No. 12/890,349; 12 pages.
Paolilli et al., U.S. Office Action mailed Sep. 3, 2013, directed to U.S. Appl. No. 13/754,476; 8 pages.
Cloutier et al., U.S. Office Action mailed Jul. 24, 2014, directed to U.S. Appl. No. 12/542,428; 10 pages.
Lee, U.S. Office Action mailed Mar. 27, 2014, directed to U.S. Appl. No. 12/333,047; 14 pages.
Dou et al., U.S. Office Action mailed Mar. 27, 2014, directed to U.S. Appl. No. 12/814,802; 14 pages.
Paolilli et al., U.S. Office Action mailed Apr. 9, 2014, directed to U.S. Appl. No. 12/890,349; 12 pages.
Dou et al., U.S. Office Action mailed Jun. 17, 2014, directed to U.S. Appl. No. 13/077,302; 12 pages.
Extended Search Report dated Nov. 14, 2012, directed to EP Application No. 08860690.0; 6 pages.
Cloutier et al., U.S. Office Action mailed Nov. 22, 2013, directed to U.S. Appl. No. 12/542,428; 10 pages.
Extended Search Report dated Nov. 21, 2012, directed to EP Application No. 09807412.3; 6 pages.
International Search Report and Written Opinion mailed May 7, 2010, directed to International Application No. PCT/US10/028685; 8 pages.
Extended Search Report dated May 3, 2013, directed to EP Application No. 10756851.1; 5 pages.
Canadian Office Action mailed Apr. 16, 2013, directed to CA Application 2,766,816; 2 pages.
Paolilli et al., U.S. Office Action mailed Oct. 10, 2013, directed to U.S. Appl. No. 13/754,215; 10 pages.
Office Action dated Jul. 7, 2014, directed to MX Application No. MX/a/2011/001623; 7 pages.
Paolilli et al. U.S. Office Action mailed Oct. 8, 2014, directed to U.S. Appl. No. 12/890,349; 16 pages.
Dou et al., U.S. Office Action mailed Dec. 17, 2014, directed to U.S. Appl. No. 12/814,802; 21 pages.
Paulino et al., U.S. Office Action mailed Jan. 23, 2015, directed to U.S. Appl. No. 13/107,149; 26 pages.
Cloutier et al., U.S. Office Action mailed Feb. 5, 2015, directed to U.S. Appl. No. 12/542,428; 11 pages.
Paulino et al., U.S. Office Action mailed Oct. 23, 2014, directed to U.S. Appl. No. 13/313,567; 12 pages.
Dou et al., U.S. Office Action mailed Nov. 5, 2014, directed to U.S. Appl. No. 12/977,647; 12 pages.
Dou et al., U.S. Office Action mailed Nov. 6, 2014, directed to U.S. Appl. No. 13/077,302; 11 pages.
Dou et al., U.S. Office Action mailed Dec. 12, 2012, directed to U.S. Appl. No. 12/977,647; 12 pages.
Paulino et al., U.S. Office Action mailed Dec. 26, 2012, directed to U.S. Appl. No. 13/107,149; 15 pages.
Paolilli et al., U.S. Office Action mailed Jan. 16, 2013, directed to U.S. Appl. No. 12/890,349; 11 pages.
Dou et al., U.S. Office Action mailed Jan. 18, 2013, directed to U.S. Appl. No. 12/814,802; 15 pages.
Dou et al., U.S. Office Action mailed Jan. 22, 2013, directed to U.S. Appl. No. 12/824,759; 9 pages.
Dou et al., U.S. Office Action mailed Feb. 14, 2013, directed to U.S. Appl. No. 13/077,302; 13 pages.
Dou et al., U.S. Office' Action mailed May 20, 2015, directed to U.S. Appl. No. 12/977,647; 12 pages.

(56) References Cited

OTHER PUBLICATIONS

Paulino et al., U.S. Office Action mailed May 21, 2015, directed to U.S. Appl. No. 13/313,567; 15 pages.
Dou et al., U.S. Office Action mailed May 22, 2015, directed to U.S. Appl. No. 13/077,302; 12 pages.
Cloutier et al., U.S. Office Action mailed Jul. 30, 2015, directed to U.S. Appl. No. 12/542,428; 5 pages.
Lee, U.S. Office Action mailed May 25, 2012, directed to U.S. Appl. No. 12/333,047; 9 pages.
Cloutier et al., U.S. Office Action mailed Jul. 6, 2012, directed to U.S. Appl. No. 12/542,428; 10 pages.
Dou et al., U.S. Office Action mailed Aug. 7, 2012, directed to U.S. Appl. No. 12/814,802; 19 pages.
Dou, et al., U.S. Office Action mailed Jun. 29, 2012, directed to U.S. Appl. No. 12/977,647; 21 pages.
Supplementary European Search Report mailed Jul. 24, 2015, directed to EP Application No. 10819546.2; 7 pages.

* cited by examiner

CEx. 1 after 3 weeks ASTM D6400

CEx. 1 after 15 weeks ASTM D6400

Ex. 8 after 3 weeks ASTM D6400

Ex. 8 after 15 weeks ASTM D6400

Ex. 1 after 3 weeks ASTM D6400

Ex. 1 after 15 weeks ASTM D6400

MULTI-LAYER HIGH MOISTURE BARRIER POLYLACTIC ACID FILM

CROSS-REFERENCE TO RELATED APPLICATION

This application claims the benefit of U.S. Provisional Application Ser. No. 61/306,210, filed Feb. 19, 2010, and is a continuation-in-part of U.S. application Ser. No. 12/890,349, filed Sep. 24, 2010, U.S. Pat. No. 9,023,433, which claims the benefit of U.S. Provisional Application Ser. No. 61/246,048, filed Sep. 25, 2009, the entire contents of which is incorporated herein by reference.

FIELD OF INVENTION

This invention relates to a metallized multi-layer biaxially oriented polylactic acid (BOPLA) film including a metal receiving layer of ethylene vinyl alcohol (EVOH) or polyvinyl alcohol (PVOH) polymer on a polylactic acid (PLA) polymer core layer or BOPLA film substrate.

BACKGROUND OF INVENTION

Biaxially oriented polypropylene (BOPP) films used for packaging, decorative, and label applications often perform multiple functions. They must perform in a lamination to provide printability, transparent or matte appearance, or slip properties; sometimes they also must provide a surface suitable for receiving organic or inorganic coatings for gas and moisture barrier properties; and sometimes must provide a heat sealable layer for bag forming and sealing or a layer that is suitable for receiving an adhesive either by coating or laminating.

However, in recent years, interest in "greener" packaging has been developing strongly. Packaging materials based on biologically derived polymers is increasing due to concerns with non-renewable resources, waste production, raw materials, and the production of greenhouse gases. Biodegradable polymers would alleviate the growing environmental problem of the production of an excessive amount of plastic waste. Non-biodegradable plastic waste requires years to decompose and comprises an ever-increasing volume fraction of the waste present in landfills. Also, it is believed that bio-based polymers, once fully scaled up, will help to reduce reliance on petroleum and thereby reduce the production of greenhouse gases due in part to their sustainably-sourced feedstocks (i.e. plant-sourced).

Bio-based polymers such as polylactic acid (PLA), which is derived from corn starch and thus can be considered to be derived from a renewable resource, is one of the more popular and commercially available materials available for packaging film applications. However, due to the commercial expense of bio-based polymers compared to traditional polymers and the difficulties that can arise in the processing of these biopolymers to form a product comparable to or matching that of existing products, there has been little commercial success. Many compositions involving these polymers exhibit limited quality, processability, degradability, or some combination thereof.

U.S. Pat. No. 5,153,074 describes the use of an extrusion-grade EVOH of typically 48 wt % ethylene content coextruded with a maleic anhydride-grafted propylene homopolymer or copolymer and biaxially oriented into a film. This film is then metallized on the EVOH surface for high barrier properties. However, such a film formulation is not degradable or sustainably-sourced. Nor is a biopolymer substrate such as PLA contemplated. In addition, the high ethylene content of the EVOH used may prevent such a material from being easily biodegradable or compostable.

U.S. Pat. No. 5,175,054 describes the use of in-line coating between the Machine Direction Orientation (MDO) and Transverse Direction Orientation (TDO), a PVOH dispersion blended with a metal-containing ionic copolymer onto a biaxially oriented polymer substrate. The ionic copolymer acts as a tie-layer resin or primer to enable good adherence of the PVOH to the polyolefin substrate. This in-line coated film is then metallized via vacuum deposition on the PVOH blend surface. However, such a structure provides little improvement in oxygen barrier properties compared to current metallized BOPP films. In addition, this reference is not directed to a biopolymer-based substrate and the films would not exhibit biodegradable or compostable properties.

U.S. Pat. No. 4,464,438 describes the blend of PVOH and EVOH with a processing aid to enable extruding and stretching such a blend into a film. However, these blends were not co-extruded or coated onto a BOPP substrate, nor is a biopolymer-based substrate contemplated.

U.S. Pat. No. 5,731,093 describes the use of an in-line coating between the MDO and TDO, a PVOH blend with polyvinylidene chloride (PVdC) onto a multilayer biaxially oriented polypropylene film substrate. The PVOH/PVdC blend's surface is then metallized via a vacuum deposition process. Excellent barrier properties are obtained, but the use of PVdC raises environmental concerns. Moreover, the polypropylene substrate would not be biodegradable.

U.S. Pat. No. 5,473,439 describes the use of crosslinked EVOH coatings on biaxially oriented polypropylene or polyethylene substrates. However, there is no indication of the efficacy of such coatings on PLA substrates. In addition, these polyolefin substrates would not be biodegradable.

U.S. patent application Ser. No. 12/332,153 describes coextrusions of polyolefin metal receiving layers on a PLA core layer to improve moisture barrier properties after metallization. However, no vinyl alcohol polymer layers are contemplated to be applied directly to the PLA substrate and the polyolefin-based metal receiving layers would not be compostable or degradable.

PCT Application PCT/US2009/54022 describes the improvement of moisture barrier properties on metallized PLA substrates via a unique process of sputter-deposited copper or other metal "seeding" or "priming" of the PLA substrate prior to aluminum vapor deposition. However, this process is not contemplated on a vinyl alcohol polymer layer applied to the PLA substrate. This reference is incorporated in its entirety in this application.

U.S. patent application Ser. No. 12/890,349 describes the improvement of moisture barrier properties of metallized PLA films by using a variety of coatings applied to the PLA substrate either via in-line or off-line coating processes including the use of EVOH/PVOH aqueous coating blends with a crosslinker. This reference is incorporated in its entirety in this application.

PlasticsToday.com article "Film Extrusion: Bioplastic Barrier Film Matches EVOH, PA" by Matt Defosse, published 17 Jul. 2009, http://www.plasticstoday.com/print/31263, describes blown and cast film products made by Colines SpA using PLA/PVOH coextrusions. However, these films are not biaxially oriented, are very thick (50-90 μm), are not metallized, and are designed for oxygen barrier and not moisture barrier.

TAPPI 2010 Conference (Apr. 18-21, 2010) presentation "Coextruded Film Structures of PLA and EVOH," by Kuraray America Inc., described blown and thermo-formed films of EVOH and PLA coextrusions for food packaging containers focusing on oxygen gas barrier properties. The presentation also only considers film structures in which the EVOH layer is a core layer encapsulated between two skin layers of PLA and not as a surface skin layer on a PLA core layer. Metallization of the structure was also not contemplated, nor as a biaxially oriented film.

SUMMARY OF THE INVENTION

We seek to improve the gas barrier properties of biaxially oriented polylactic acid-based films, particularly for moisture vapor barrier. The inventors have found that these properties may be improved by utilizing a metal receiving layer including uncrosslinked EVOH or PVOH contiguously attached to a PLA core or substrate layer and metallized upon the metal receiving layer. Although crosslinking of the EVOH or PVOH is an option to improve further the moisture barrier properties of the PLA-based film, crosslinked vinyl alcohol polymers can present problems in forming unacceptable gels when such film is recycled or repelletized to be used in new PLA-based film for the purposes of reducing cost. It is also contemplated to add certain types of pro-degradants or degradation accelerators to the vinyl alcohol-containing layer to improve degradability of the overall film for compostability or litter abatement purposes, particularly if extrusion-grade EVOH polymers are used.

One embodiment is a biaxially oriented coextruded laminate film including a skin layer of extrusion-grade high ethylene content EVOH of 27-48 mol % ethylene, and preferably 38-48 mol % ethylene, upon a PLA core or base layer. The extrusion-grade EVOH is coextruded with the PLA core layer, upon one side of the PLA core layer, through a compositing die, is quenched, and then biaxially oriented either sequentially or simultaneously in both the machine direction (MD) and transverse direction (TD). This coextruded film structure may be discharge-treated upon the side of the EVOH layer opposite the PLA core layer, and a metal such as aluminum vapor-deposited upon the surface of the EVOH layer opposite the PLA core layer.

Additives may be included with the extrusion-grade EVOH layer of the biaxially oriented coextruded PLA-based film. Such additives may be designed or formulated to enhance the degradation properties of the extrusion-grade high ethylene content EVOH. The ethylene co-monomer content of the vinyl alcohol polymer is relatively high, which can retard the compostability or degradability properties of the overall PLA-based film. Such pro-degradent additives can help break-down the ethylene portion of the EVOH polymer catalytically and thus help microbes to digest and decompose further those portions of the EVOH polymer.

In another embodiment, an aqueous solution of an EVOH polymer can be coated contiguously onto one side of a PLA substrate. The EVOH of this embodiment is typically of low ethylene content (10 mol % or less) such that the EVOH is soluble in water. The EVOH solution is preferably applied to the polylactic acid resin-containing layer by means of an in-line coater to the polylactic acid base layer during the biaxial orientation process, preferably between the machine direction orientation process (MDO) and the transverse orientation process (TDO). This can also be applied in a simultaneous orientation process in which the coating is applied in-line between the casting unit and the simultaneous stretching oven. By this means, the width of the in-line coater can be maintained at a reasonable width (e.g., the width of the machine-direction oriented sheet) and capital cost, and the tenter oven can be used as a drying oven to remove the water from the aqueous solution. Additionally, optional defoamers may be added to the EVOH coating to help reduce foam generation during the coating process. Optional anti-microbial agents may be added to the coating solution as well in order to inhibit bacterial or mold growth to enable long-term storage and shelf-stability prior to use.

Alternatively, the EVOH coating solution may be applied to one side of the PLA-based base layer or substrate by means of an out-of-line or off-line coating process. In this embodiment, an already-produced biaxially oriented PLA-based film—which may be discharge-treated on one or both sides of the film to enhance coating wet-out and adhesion—can be coated with the EVOH upon the desired discharge-treated surface by means well-known in the art on a separate off-line gravure or metering rod coater and dried and re-wound. This coated PLA film roll may then be metallized via vacuum deposition upon the surface of the coating.

Another embodiment can use an extrusion-grade PVOH to be coextruded as a skin layer with the PLA-based core layer, similar to the extrusion-grade EVOH embodiment described previously. The surface of the coextruded PVOH skin layer opposite the PLA core layer can then be metallized via vacuum deposition.

In yet another embodiment, an aqueous solution of PVOH may be applied contiguously onto one side of the PLA-based core layer or substrate layer via in-line coating or off-line coating as described previously for EVOH coatings.

In addition, it can be contemplated to utilize blends of EVOH and PVOH—either blends of the extrusion-grade resin versions or blends of the solution-grade versions—as a contiguous layer upon one side of the PLA-based core or substrate layer, which can then be subsequently metallized upon the blended layer.

In these embodiments, the EVOH or PVOH polymer-containing layer is directly on a first polylactic acid resin-containing layer, which can also be a core or base layer providing bulk strength properties. The first polylactic acid resin-containing layer can optionally include a tie-layer or adhesion-promoting material to improve further adhesion of the EVOH or PVOH polymer-containing layer to the first PLA-containing layer. In other embodiments, the laminate film can further include a second polylactic acid resin-containing layer on the side of the first polylactic acid resin-containing layer opposite the coating receiving side. This second polylactic acid resin-containing layer could also be considered a core layer to provide the bulk strength of the laminate film if the first layer is simply a relatively thin layer for supporting the metal receiving layer. Furthermore, there are embodiments in which the laminate could further include an additional polylactic acid resin-containing layer on the first or second polylactic acid resin-containing core layer opposite the side with the first PLA resin-containing metal receiving layer for the purposes of heat sealability or winding or lamination.

The first polylactic acid resin-containing layer is comprised of crystalline PLA, amorphous PLA, or a blend of crystalline and amorphous PLA, which provides good adhesion with the polar EVOH or PVOH polymer-containing layer. In another variation of the first polylactic acid resin-containing layer, it can also include other optional ingredients such as an amount of ethylene-acrylate copolymer that can act as a processing aid to enable high transverse orientation rates of up to 8-11×, particularly if this layer is comprised of a majority amount of crystalline PLA. Without such a processing aid, transverse orientation rates of a highly crystalline PLA layer would be on the order of 3-5×. The first PLA layer may also include an amount of amorphous PLA blended with the crystalline PLA as well as the optional ethylene-methacrylate copolymer. Another embodiment is that the first PLA-containing layer may also be comprised of substantially 100 wt % amorphous PLA as this composition can provide improved coating adhesion compared to a layer of substantially crystalline PLA. The first PLA-based resin layer can also comprise of various additives such as antiblock particles to allow for easier film handling. Non-migratory antiblocks are preferred over migratory slip agents such as fatty amides or silicone oils. Additionally, for coating application of the EVOH or PVOH solutions, this first polylactic acid-containing resin layer may also be discharge treated in-line after machine direction orientation, but prior to in-line solution coating to aid in wet-out of the coating onto the substrate. Similarly, for an off-line coating application, it is preferable to discharge-treat the coating-receiving layer prior to coating.

Preferably, the second polylactic-acid resin-containing core layer includes a blend of amorphous and crystalline polylactic acid. Preferably, this core PLA resin-containing layer includes a crystalline polylactic acid homopolymer of about 90-100 wt % L-lactic acid units (or 0-10 wt % D-lactic acid units). An optional amount of amorphous PLA may also be blended in with the crystalline PLA from 0-48 wt % of the core layer. The amorphous PLA is also based on L-lactic acid units but has greater than 10 wt % D-lactic acid units and/or meso-lactide units (which includes one each of L and D lactic acid residuals). A preferred amount of amorphous PLA to be blended with the crystalline PLA is about 15 wt % of the first layer. An optional amount of an ethylene-acrylate copolymer component of the first layer formulation can be used in the amount from about 2-10 wt % of the core layer, particularly if it is desired to make this multi-layer film by a biaxial orientation process in which transverse orientation could be greater than about 5 times. It is also contemplated to add to the core layer antiblock particles of suitable size, selected from amorphous silicas, aluminosilicates, sodium calcium aluminum silicates, crosslinked silicone polymers, and polymethylmethacrylates to aid in machinability and winding, particularly if this core layer is part of only a mono-layer film design or a 2-layer coextruded film design. Suitable amounts of antiblock range from 0.03-0.5% by weight of the core layer and have typical particle sizes of 2.0-6.0 µm in diameter.

Preferably, the third polylactic acid resin-containing layer includes a heat sealable PLA resin-containing layer including an amorphous PLA of greater than 10 wt % D-lactic acid units. It is not necessary to use any of the impact modifier/process aid ethylene-acrylate copolymer in this case, as the amorphous PLA can be oriented relatively easily at high TD orientation rates. This coextruded heat sealable amorphous PLA resin-containing layer can also include an antiblock component selected from amorphous silicas, aluminosilicates, sodium calcium aluminum silicates, crosslinked silicone polymers, and polymethylmethacrylates to aid in machinability and winding and to lower coefficient of friction (COF) properties. Suitable amounts range from 0.03-0.5% by weight of the core layer and typical particle sizes of 2.0-6.0 µm in diameter, depending on the final thickness of this layer. Migratory slip additives may also be contemplated to control COF properties such as fatty amides (e.g. erucamide, stearamide, oleamide, etc.) or silicone oils ranging from low molecular weight oils to ultra high molecular weight gels. Suitable amounts of slip additives to use can range from 300 ppm to 10,000 ppm of the layer.

Optionally, this third polylactic acid-containing layer may be a non-heat-sealable surface or a winding surface containing antiblock and/or slip additives for good machinability and low coefficient of friction (COF). Furthermore, if this third layer is used as a winding surface, its surface may also be modified with a discharge treatment to make it suitable for laminating or converter-applied adhesives and inks.

Generally, however, where the above embodiments are to be used as a substrate for vacuum deposition metallizing, it is recommended that migratory slip additives not be used as these types of materials may adversely affect the metal adhesion or metallized gas barrier properties of the metallized BOPLA film. It is thought that as the hot metal vapor condenses on the film substrate, such fatty amides or silicone oils on the surface of the film could vaporize and cause pin-holing of the metal-deposited layer, thus compromising gas barrier properties. Thus, only non-migratory antiblock materials should be used to control COF and web-handling.

Further preferably, the substrate film is produced via extrusion of the first PLA layer (or coextruded with other PLA-containing polymeric layers as desired) through a compositing die whereupon the molten film is quenched upon a chilled casting roll system or casting roll and water bath system and subsequently oriented in the machine and/or transverse direction into a biaxially oriented film. Machine direction orientation rate is typically 2.0-3.0× and transverse direction orientation is typically 3.0-5.0×. With the use of the ethylene-acrylate impact modifier process aid in the core layer, transverse direction orientation can be increased to typically 8.0-11.0×. Heat setting conditions in the TDO oven is also critical to minimize thermal shrinkage effects. The film is wound into a roll form.

The EVOH or PVOH layer's outer surface may be discharge-treated after biaxial orientation or prior to metallization to help improve metal formation and adhesion. In one variation, the discharge-treating of the EVOH or PVOH layer occurs after orientation. This discharge-treated vinyl alcohol resin-containing layer has a discharge-treated surface formed in an atmosphere of $CO_2$ and $N_2$. Other discharge-treatments can also be used such as electrical corona in air, flame, or other discharge-treatment methods using a controlled atmosphere or blend of gases.

The aforementioned film roll is then placed within a vacuum metallization chamber in which high-speed vapor deposition of metal upon the exposed surface of the vinyl alcohol polymer layer takes place, preferably with aluminum, by metallizing processes, which are well-known in the art. Typical optical density of the aluminum is 1.5-5.0, preferably 2.2-3.2. Optionally, a "primer" layer of a different metal may be sputter-deposited in-chamber prior to the aluminum vapor deposition. Such a "primer" layer of metal ions can improve subsequent aluminum nucleation and adhesion to the substrate, resulting in better and more consistent gas barrier properties. A preferred "primer" metal can be copper.

Another embodiment is a method for flexible packaging including obtaining a laminate film including an EVOH or PVOH-containing layer on the first PLA resin-containing layer and surrounding a product by the laminate film. Preferably, the product is a food product.

In yet another embodiment, this invention provides biaxially oriented PLA multi-layer films with a skin layer of polar EVOH or PVOH polymer to enhance gas barrier properties for flexible packaging purposes. An additional embodiment provides laminate structures of PLA layers and the vinyl alcohol polymer layers for barrier applications in flexible packaging.

This invention provides a method to improve the gas barrier of biaxially oriented films and metallized films resulting in a packaging film with excellent gas barrier properties. The invention provides a method to produce film with a metallized coating, resulting in improved moisture vapor and oxygen barrier properties.

The laminate film of the invention includes at least a 2-layer laminate film wherein the first layer is an oriented film comprised substantially of PLA, either monoaxially or biaxially, the preferred being biaxially oriented. The second layer is comprised of one of the EVOH or PVOH materials and is contiguously attached to one surface of the first PLA layer.

All these embodiments can also be metallized via vapor-deposition, preferably with the aforementioned vapor-deposited aluminum layer.

Additional advantages of this invention will become readily apparent to those skilled in the art from the following detailed description, wherein only the preferred embodiments of this invention are shown and described, simply by way of illustration of the best mode contemplated for carrying out this invention. As will be realized, this invention is capable of other and different embodiments, and its details are capable of modifications in various obvious respects, all without departing from the spirit of the invention. Accordingly, the drawings and description are to be regarded as illustrative in nature and not as restrictive.

DETAILED DESCRIPTION OF THE INVENTION

Figure 1A:
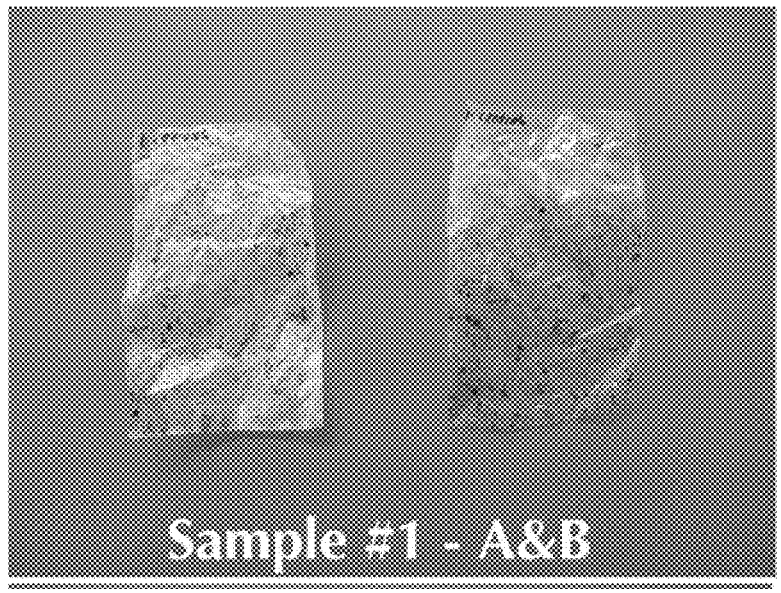
FIG. 1A is a photograph of the control PLA film of CEx. 1 after 3 weeks of exposure to the conditions outlined in ASTM D6400.

Described are metallized multi-layer biaxially oriented polylactic acid (BOPLA) films that include a metal receiving layer of ethylene vinyl alcohol (EVOH) or polyvinyl alcohol (PVOH) polymer on a polylactic acid (PLA) polymer core layer or BOPLA film substrate. The EVOH or PVOH may be applied either as a coextrusion with the PLA core layer or as a coating applied either in-line with film-making or off-line on an already oriented PLA film substrate. Metallizing of such a film design upon the EVOH or PVOH layer has surprisingly shown substantial improvements in moisture and oxygen barrier properties compared to metallized BOPLA films without such a layer. An additive may optionally be added to the EVOH or PVOH layer to enhance bio-degradability of the layer.

For bio-based polymer films to be fit-for-use for many snack food packaging applications, it is desirable that the bio-based polymer films match as many of the attributes as possible of known BOPP films used for these application. These bio-based films should achieve the same level of quality and performance, that BOPP films are well-known for such as heat sealability, printability, controlled COF, metallizability, barrier, etc. In particular, for high barrier packaging, metallized oriented PLA films should demonstrate good oxygen and moisture barrier properties. These properties are important for maintaining the shelf-life and freshness of the packaged snack food.

For metallized oriented PLA in particular, high oxygen barrier property is generally easily achieved due to the polar nature of PLA, which provides good hydrogen-bonding of the polymer molecules. However, this polar nature tends to be detrimental for achieving high moisture barrier. Without being bound by any theory, the thought is that water molecules—being polar themselves—may more easily migrate through a polar polymer film than a non-polar polymer film. In order to achieve a useful protection of snack food products from staleness and/or rancidity, and to ensure a reasonably adequate shelf-life, it is preferable to have a moisture barrier property of at least about 1.0 $g/m^2/day$ or better, and more preferably, to have a moisture barrier property of about 0.50 $g/m^2/day$ or better, at 38° C. and 90% RH. It is preferable to have an oxygen barrier of at least about 46.5 $cc/m^2/day$, and more preferably 31 $cc/m^2/day$ or better, at 23° C. and 0% RH.

Many PLA-based packaging film products currently on the market do not provide satisfactory moisture barrier properties. For example, Celplast Metallized Products, Ltd.'s Enviromet™ high barrier metallized PLA film typical data sheet describes a product that exhibits an excellent oxygen barrier of 6.2 $cc/m^2/day$ (at 23° C., 50% relative humidity or RH) but a relatively poor moisture barrier of 3.1 $g/m^2/day$ (at 38° C., 90% RH) as compared to typical metallized biaxially oriented polypropylene films. (High barrier metallized BOPP such as Toray Plastics (America), Inc.'s PWX3 product typically demonstrates oxygen barrier of 15.5 $cc/m^2/day$ (23° C., 0% RH) and moisture barrier of 0.155 $g/m^2/day$ (38° C., 90% RH). Another manufacturer of barrier PLA film, Alcan Packaging Inc., produces a silicon oxide coated PLA film under the tradename Ceramis® whose typical data sheet shows an oxygen barrier of 7.75 $cc/m^2/day$ (23° C., 50% RH) and moisture barrier of 7.75 $g/m^2/day$ (38° C., 90% RH). Biofilm S.A. promotional literature (such as presented at the "Innovation Takes Root" conference hosted by NatureWorks LLC at Las Vegas, Nev. Sep. 16-18, 2008) discusses transparent barrier PLA films demonstrating moisture barrier of 3-10 $g/m^2/day$ (38° C./90% RH) using various vacuum chamber deposition processes.

While one could employ traditional polymers, such as polypropylene or polyethylene, that exhibit good moisture barrier properties as an outer layer to improve the effectiveness of this barrier and thereby the quality of the product, such an incorporation would impact degradability or compostability, which are desirable characteristics of some bio-based polymers like PLA. To retain degradability and quality, any other components must be degradable and commercially reasonable. In addition, it is known that there exist alternative polymers that are easily degraded and techniques that will improve barrier properties of such a film.

Thus, it is desirable for the BOPLA to have high moisture vapor and oxygen barrier properties. Metallization of BOPLA via vacuum deposition of aluminum is a known, cost effective method to significantly improve the moisture and oxygen barrier properties of packaging films in general and provides a light barrier to protect the food product wrapped by such a film. The inventors have found that gas barrier properties of BOPLA films, especially for moisture vapor, can be surprisingly improved by applying to a BOPLA substrate film a metal receiving layer including polyethylene vinyl alcohol (EVOH) or polyvinyl alcohol (PVOH), or blends thereof. When metallized, these additional layers improve greatly gas barrier properties and, surprisingly, moisture barrier properties, since these polar polymers are well-known for their oxygen-barrier properties rather than moisture barrier. Thus, this invention can be useful to food manufacturers in providing packages that can greatly extend their products' shelf-life and freshness. In addition, since EVOH and PVOH are highly polar materials and some grades are water-soluble, it is possible that these materials can be degradable or partially degradable such that when combined as a thin metal receiving layer with a compostable and degradable bulk or substrate layer like PLA, they can allow the overall film structure to decompose in a timely manner, particularly in industrial composting conditions.

EVOH can be used as a layer applied contiguously on a PLA substrate or core layer by several means such as coextrusion with the PLA substrate or as a coating applied to the PLA substrate. In the case of a coextrusion, followed by subsequent biaxial orientation, it is generally an extrusion-grade EVOH with a higher ethylene content of 27 to 48 mol % is used. Preferably, extrusion-grade EVOH of 38-48 mol % is used, especially at higher transverse direction orientation rates of 5-10 times. In particular, if transverse orientation rates are in the range of 8-10 times, the 48 mol % ethylene content EVOH may be most preferred as it can withstand the orientation stresses without cracking or fracturing. Such cracking of the EVOH layer could result in poor gas barrier properties. In general, with BOPLA production, due to the crystallinity and hydrogen bonding that PLA has, transverse direction orientation is limited to about 4-5 times unless modifiers or process aids are used to improve the resin's properties for orientation.

It can also be contemplated to extrusion-coat an extrusion-grade EVOH onto the PLA basefilm by using an extruder and die positioned between the machine direction orienter (MDO) and transverse direction orienter (TDO) in the case of sequential orientation (or prior to the tenter oven in the case of simultaneous orientation). It can also be contemplated to extrusion-coat an extrusion-grade EVOH directly onto an already-made biaxially oriented (or mono-axially oriented or cast) PLA film.

In the case of coating EVOH onto a PLA substrate, this can be achieved, for example: 1) by in-line coating in which a coating station is positioned on the biaxial orientation film line between the machine and transverse direction orientation processes (i.e. sequential orientation) or prior to the tenter oven in the case of simultaneous orientation; or 2) via off-line coating in which the EVOH is coated onto an already-made PLA film substrate as a separate process. It is preferable to use EVOH grades that can be dissolved in water to make an aqueous solution.

In order to develop an aqueous coating solution, EVOH grades of very low ethylene content are preferably selected (e.g. less than 10 mol % ethylene content) in order for it to dissolve in water. Such low ethylene content EVOH provides excellent barrier properties. However, upon transverse direction orientation, such EVOH could crack causing poor barrier properties due to the highly crystalline nature of such a low ethylene content polymer. In addition, these very low ethylene content EVOH may be prone to poor metal adhesion due to cohesive failure of the EVOH layer. Without being bound by any theory, such very low ethylene content EVOH may have a Tg in excess of 60° C. and relatively low molecular weight of 80,000-130,000 g/mol. This may make the EVOH layer relatively brittle in comparison to polyolefin substrates (e.g. polypropylene Tg −10° C., MW ca. 350,000 g/mol) and more prone to cohesive failure when tested for metal adhesion. Higher ethylene content EVOH suitable for extrusion (e.g. 48 mol % ethylene) have a lower Tg and higher molecular weights which may not be as prone to cohesive failure and can offer stronger metal adhesion. Thus, such EVOH aqueous coatings may be best and preferably applied by using off-line coating methods vs. in-line coating methods to avoid the possibility or tendency for EVOH to crack during transverse orientation. Additionally, EVOH materials can be prone to barrier loss under humid conditions wherein the humidity can cause swelling and plasticization of the polymer. Crosslinking of the EVOH can help remedy this and improve the gas barrier properties under humid conditions. However, crosslinking of the EVOH could present problems in recycling and re-use of such EVOH/PLA film structures back as a component of new PLA film as the crosslinked EVOH will form gels that can thermally degrade or disperse poorly and cause appearance and processability problems of such films. An uncrosslinked EVOH layer on a PLA core layer could be reprocessed back into new PLA film by using compatibilizing agents to help disperse the recycled EVOH in the core layer.

Similarly, with PVOH materials, extrusion-grade versions, although rarer than extrusion-grade EVOH, are becoming more available. In addition, they offer an advantage over EVOH in that they are more readily degradable and compostable. For example, Nippon Gohsei's Nichigo® G-Polymer™ grade PVOH OKS-8049P is suitable for extrusion applications, can dissolve in water, and is biodegradable. This polymer can be coextruded with PLA as part of an extruded multi-layer film and oriented; or it can be extrusion-coated onto an already-made PLA film substrate; or it can be extrusion-coated onto a PLA sheet prior to orientation processes.

Aqueous coatings grades of PVOH are also readily available, have been used in off-line coating processes with many film and paper substrates, and can be applied to a PLA substrate. In-line coating of PVOH can also be accomplished with orientation of PLA film. However, PVOH can be prone to a loss of barrier properties under humid conditions wherein the humidity can cause swelling and plasticization of the polymer as mentioned above with EVOH. One way to remedy this is to crosslink the PVOH; this restricts swelling and plasticization and improves the barrier properties of PVOH under humid conditions. However, this crosslinking could make the PVOH coating difficult to orient in an in-line coating process and so an off-line coating process would be preferred. If the PVOH is crosslinked to a high degree, the coating could fracture or crack under the orientation stresses, resulting in a loss of barrier properties. In addition, crosslinking of the PVOH could present problems in recycling and re-use of such PVOH/PLA film structures back as a component of new PLA film as the crosslinked PVOH will form gels that can thermally degrade or disperse poorly and cause appearance and processability problems of such films. An uncrosslinked PVOH layer on a PLA core layer could be reprocessed back into new PLA film by using compatibilizing agents to help disperse the recycled PVOH in the core layer.

In the case of coextruding EVOH or PVOH extrusion-grade polymers with PLA, the inter-layer adhesion between the EVOH or PVOH metal adhesion layer and the PLA core layer may be relatively weak. This inter-layer adhesion can be improved by incorporating an appropriate tie-resin blended into one of the layers (either the PLA core layer or the EVOH or PVOH skin layer) or both of the layers. A discrete tie-resin layer can alternatively be coextruded between the PLA core layer and the EVOH or PVOH skin layer. In general, for coated films, interlayer adhesion tends to be adequate, but if improved adhesion is desired or required, the use of similar tie-resins or tie-layers can be used as well.

Polyvinylidene chloride coatings (PVDC), provide both oxygen and moisture vapor barrier improvements when applied to film substrates; however, the current social climate with the environmental impacts of packaging have made the use of PVDC coatings in packaging structures unfavorable due to the potential generation of hazardous substances (e.g. HCl gas) when reprocessing or incinerating PVDC-containing materials.

Provided are methods for achieving high moisture and oxygen barrier properties with polymer films while simultaneously incorporating sustainable, bio-based resin content, maintaining degradable properties, and maintaining a reasonable economical process. The inventors have found solutions whereby a multilayer film design incorporates the use of an EVOH, PVOH, or blend of PVOH and EVOH, as a metal receiving layer on a PLA core layer or PLA substrate, which is then coated with aluminum via vapor deposition metallization. This film structure provides improved moisture barrier properties, maintains a majority composition of bio-polymer in the total film construction (ca. 90 wt % or more), and is degradable under biodegradation or composting environmental conditions. It is also contemplated to add an optional amount of a pro-degradant such as an oxo-degradable additive to the EVOH or PVOH layer to enhance degradability, particularly in the case of using extrusion-grade ethylene vinyl alcohol polymers, which have a higher ethylene content than the solution-grade versions.

In one embodiment of the invention, the laminate film includes a multi-layer coextruded film of: 1) a first heat sealable skin layer comprised preferably of amorphous PLA, coextruded onto one side of a core layer; 2) A coextruded core layer including a crystalline polylactic acid (PLA) polymer and blended with an optional minority amount of amorphous polylactic acid polymer, preferably in the ratio of 85 wt % crystalline PLA and 15 wt % amorphous PLA (this core layer blend can also be optionally blended with an amount of ethylene-acrylate copolymer to help enable high transverse orientation); 3) A coextruded skin layer for use as a coating-receiving layer including preferably crystalline PLA; 4) a coating layer of EVOH, PVOH, or blends thereof, which is in-line or off-line coated onto the surface of the coating-receiving skin layer opposite the heat sealable or non-heat sealable winding layer. This coating layer also provides a suitable surface for vapor deposition of metal (aka metal adhesion layer); 5) An optional (but preferred) "primer" layer of metal preferably including copper (although other metals can be contemplated) deposited upon one side of the coating layer; 6) A layer of metal preferably including aluminum (although other metals can be contemplated) deposited upon the side of the primer metal layer opposite the side contacting the coating layer.

In another embodiment of the invention, the laminate film includes a multi-layer coextruded film of: 1) a first heat sealable skin layer comprised preferably of amorphous PLA, coextruded onto one side of a core layer; 2) A coextruded core layer including a crystalline polylactic acid (PLA) polymer and blended with an optional minority amount of amorphous polylactic acid polymer, preferably in the ratio of 85 wt % crystalline PLA and 15 wt % amorphous PLA (this core layer blend can also be optionally blended with an amount of ethylene-acrylate copolymer to help enable high transverse orientation); 3) A coextruded skin layer comprised of EVOH, PVOH, or a blend thereof, for use as a metal-receiving layer on the side of the PLA core layer opposite the PLA heat sealable layer; 4) An optional (but preferred) "primer" layer of metal preferably including copper (although other metals can be contemplated) deposited upon one side of the metal receiving layer; 5) A layer of metal preferably including aluminum (although other metals can be contemplated) deposited upon the side of the primer metal layer opposite the side contacting the metal receiving layer.

Further embodiments of the inventive laminate film include a similar construction as the above embodiments, except that the heat sealable amorphous PLA layer is replaced by a non-heat sealable winding layer, preferably comprised of a crystalline PLA or a blend of crystalline PLA and a minority amount of amorphous PLA and inorganic antiblocking agents.

Yet another embodiment of the inventive laminate film includes a layer of EVOH, PVOH, or blends thereof, contiguously attached to the PLA-including core layer without the inclusion of other PLA-including coextruded layers. This embodiment then has the optional metal priming layer deposited on the surface of the vinyl alcohol polymer layer opposite the PLA core layer, and the metal layer deposited in turn upon the optional priming layer.

The coextruded PLA first skin layer can be include either crystalline PLA resin or amorphous PLA resin or blends thereof. In the case where crystalline PLA resin is part of this layer's formulation, an amount of ethylene-acrylate copolymer can optionally be incorporated as a process aid to help enable high transverse orientation. Generally, it is preferable to use primarily an amorphous PLA to impart heat sealable characteristics to this film design. If using this layer as a non-heat sealable layer, it is usually desirable to discharge-treat the exposed surface of this layer in order to provide further functionality as a surface to receive metallization, printing, coating, or laminating adhesives.

The coextruded first skin layer can be a heat sealable layer having a thickness after biaxial orientation of between 0.5 and 5 µm, preferably between 1.0 and 2.0 µm. The amorphous PLA is preferably based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000. The preferred amount to be used as a heat sealable skin layer is about 100 wt % of the layer. It is also preferred to add an amount of inorganic antiblock to this layer to aid in web-handling, COF control, film winding, and static control, among other properties. Suitable amounts would be about 1000-5000 ppm of the heat sealable resin layer, preferably 3000-5000 ppm.

The polylactic acid resin comprising the second, core layer is a crystalline polylactic acid of a specific optical isomer content and can be biaxially oriented. As described in U.S. Pat. No. 6,005,068, lactic acid has two optical isomers: L-lactic acid (also known as (S)-lactic acid) and D-lactic acid (also known as (R)-lactic acid). Three forms of lactide can be derived from these lactic acid isomers: L,L-lactide (also known as L-lactide) and which includes two L-lactic acid residuals; D,D-lactide (also known as D-lactide) and which includes two D-lactic acid residuals; and meso-lactide which includes one each of L and D-lactic acid residuals. The degree of crystallinity is determined by relatively long sequences of a particular residual, long sequences either of L or of D-lactic acid. The length of interrupting sequences is important for establishing the degree of crystallinity (or amorphous) and other polymer features such as crystallization rate, melting point, or melt processability. The crystalline polylactic acid resin is preferably one comprised primarily of the L-lactide isomer with minority amounts of either D-lactide or meso-lactide or combinations of D-lactide and meso-lactide. Preferably, the minority amount is D-lactide and the amount of D-lactide is 10 wt % or less of the crystalline PLA polymer. More preferably, the amount of D-lactide is less than about 5 wt %, and even more preferably, less than about 2 wt %. Suitable examples of crystalline PLA for this invention are Natureworks® Ingeo™ 4042D and 4032D. These resins have relative viscosity of about 3.9-4.1, a melting point of about 165-173° C., a crystallization temperature of about 100-120° C., a glass transition temperature of about 55-62° C., a D-lactide content of about 4.25 wt % and 1.40 wt % respectively, density of about 1.25 g/cm$^3$, and a maximum residual lactide in the polylactide polymer of about 0.30% as determined by gas chromatography. Molecular weight $M_w$ is typically about 200,000; $M_n$ typically about 100,000; polydispersity about 2.0. Natureworks® 4032D is the more preferred crystalline PLA resin, being more crystalline than 4042D and more suitable for high heat biaxial orientation conditions. In addition, the 4042D PLA grade contains about 1000 ppm of erucamide and for some applications, particularly for gas barrier metallizing, may not be suitable.

This second PLA resin-including core layer can be of any thickness after biaxial orientation, but is typically 8 μm to 100 μm in thickness, preferably between 10 μm and 50 μm, and more preferably between about 15 μm and 25 μm in thickness. A preferred embodiment is to use the higher crystalline, higher L-lactide content PLA (lower wt % D-lactide of about 1.40) such as Natureworks® 4032D.

The core PLA resin-including layer can also optionally include an amount of amorphous PLA resin blended with the crystalline PLA to improve further extrusion processing and oriented film processing. The addition of amorphous PLA in the core layer helps to lower extrusion polymer pressure and in terms of film manufacturing, helps to reduce or slow crystallization rate of the newly oriented film. This aids in the orientation of the PLA film in both machine and transverse directions and helps reduce defects such as uneven stretch marks. It also helps with the slitting of the biaxially oriented film at the edge-trimming section of the film orientation line by reducing the brittleness of the edge trim and reducing the instances of edge trim breaks, which can be an obstacle to good productivity. The amorphous PLA is preferably based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000. Suitable amounts of amorphous PLA to use in the first PLA resin-including layer are concentrations of up to about 48 wt % of the first layer, preferably up to about 30 wt % of the first layer, and even more preferably about 15 wt % of the first layer. It should be noted, however, that too much amorphous PLA in the first layer (e.g. 50% or greater) can cause high thermal shrinkage rates after biaxial orientation and in spite of heat-setting conditions in the transverse orientation oven to make a thermally stable film. A thermally, dimensionally stable film is important if the substrate is to be used as a metallizing, printing, coating, or laminating substrate so as to minimize shrinkage effects of the substrate in those operations. Preferred thermal shrinkage values for BOPLA is typically less than about 10% in both the MD and TD—preferably less than 5% shrinkage in the MD and less than 10% in the TD—at 121° C. for 5 minutes.

Another optional component that can be blended into the primarily crystalline PLA second core layer is a minority amount of ethylene-acrylate copolymer to enable high transverse orientation rates similar to that used in BOPP orientation, if desired. It may be desirable to do this, as the higher orientation rate may be beneficial for profile control and economies of scale in terms of a wider film production. Ethylene-acrylates are of the general chemical formula of $CH_2=C(R^1)CO_2R^2$ where $R^1$ can be hydrogen or an alkyl group of 1-8 carbon atoms and $R^2$ is an alkyl group of 1-8 carbon atoms. Ethylene-acrylate copolymers contemplated for this invention can be based on ethylene-acrylate, ethylene-methacrylate, ethylene-n-butyl acrylate-glycidyl methacrylate, ethylene-glycidyl methacrylate, ethylene-butyl-acrylate, ethylene acrylic esters, or blends thereof. Ethylene vinyl acetate (EVA) and ethylene methacrylate (EMA) can also be contemplated. Other similar materials may also be contemplated. As described in U.S. Pat. No. 7,354,973, suitable compositions of the ethylene-acrylate copolymers can be about 20-95 wt % ethylene content copolymerized with about 3-70 wt % n-butyl acrylate and about 0.5-25 wt % glycidyl methacrylate monomers. A particularly suitable ethylene-acrylate copolymer of this type is one produced by E. I. DuPont de Nemours and Company Packaging and Industrial Polymers Biomax® Strong 120. This additive has a density of about 0.94 g/cm$^3$, a melt flow rate of about 12 g/10 minutes at 190° C./2.16 kg weight, a melting point of about 72° C., and a glass transition temperature of about −55° C. Other suitable ethylene-acrylate copolymer impact modifiers commercially available are: Dupont Elvaloy® PTW, Rohm & Haas, Inc. BPM500, and Arkema, Inc. Biostrength® 130.

Suitable amounts of ethylene-acrylate copolymer to be blended in the crystalline PLA-including core layer is from about 2-10 wt % of the first layer, preferably about 2-7 wt % and more preferably, about 3-5 wt %. At these concentrations, acceptable clarity of the biaxially oriented film is maintained. Too much ethylene-acrylate may cause haziness; too little may not enable transverse orientation at high rates like 8-10×. Blending into the first layer can be done most economically by dry-blending the respective resin pellets; it is contemplated that more aggressive blending such as melt-compounding via single-screw or twin-screw can result in better dispersion of the ethylene-acrylate copolymer throughout the PLA matrix.

Additionally, the PLA-including core layer may also include an optional minority amount of antiblocking additives when considering a film design including only of the core PLA-including layer with the EVOH or PVOH layer on one side of the core layer. In such an embodiment, it could be desirable to add an amount of antiblocking agent to this core PLA resin-including layer for aiding machinability and winding. An amount of an inorganic antiblock agent can be added in the amount of about 100-5000 ppm of the PLA resin-including layer, preferably about 300-2000 ppm. Preferred types of antiblock are spherical sodium aluminum calcium silicates or an amorphous silica of nominal 2-6 μm average particle diameter, but other suitable spherical inorganic antiblocks can be used including crosslinked silicone polymer (such as Momentive Performance Material Inc.'s Tospearl® grades of polymethylsilsesquioxane of nominal 2.0 and 3.0 μm sizes) or polymethylmethacrylate, and ranging in size from about 2 μm to 6 μm. Preferred is a nominal 3 μm spherical sodium aluminum calcium silicate manufactured by Mizusawa Chemicals under the tradename Silton® JC-30 at a loading of about 500 ppm in the PLA resin-including layer.

Preferred types of antiblock are spherical, crosslinked silicone polymer such as Momentive's Tospearl® grades of polymethylsilsesquioxane of nominal 2.0 and 3.0 μm sizes. Alternatively, sodium aluminum calcium silicates of nominal 3 μm in diameter can also be used (such as Mizusawa Silton® JC-30), but other suitable spherical inorganic antiblocks can be used including polymethylmethacrylate, silicas, and silicates, and ranging in size from about 2 μm to 6 μm. Migratory slip agents such as fatty amides or silicone oils can also be optionally added to the heat seal resin layer of types and quantities mentioned previously if lower COF is desired. However, if the films of this invention are desired to be used for metallizing, it is recommended that the use of migratory slip additives be avoided in order to maintain metallized barrier properties and metal adhesion.

In the embodiment of applying an aqueous coating of EVOH or PVOH to form a metal receiving layer, the third coextruded coating-receiving layer is comprised of PLA, preferably crystalline PLA, either by itself or as the majority component of a blend with amorphous PLA. However, it can be contemplated that the coating-receiving layer can be comprised substantially of amorphous PLA as well. The use of amorphous PLA could help improve adhesion of the coating to the PLA substrate. As discussed previously, if crystalline PLA is used for this layer, an optional amount of ethylene-acrylate copolymer can be used as part of this layer to aid transverse orientation rates. Suitable amounts of ethylene-acrylate copolymer to use in this skin layer are about 2-10 wt %, preferably about 2-7 wt % and, more preferably, about 3-5 wt %. Preferably, non-migratory inorganic slip and/or antiblock additives as described previously should be used to maintain gas barrier properties and metal adhesion if metallizing, or ink wetting and ink adhesion if printing. It is also preferred to add an amount of inorganic antiblock to this layer to aid in web-handling, COF control, film winding, and static control, among other properties. Suitable amounts would be about 100-1000 ppm of this coating-receiving layer, preferably about 300-500 ppm. Preferred types of antiblock are spherical crosslinked silicone polymer such as Momentive's Tospearl® grades of polymethlysilsesquioxane of nominal 2.0 and 3.0 μm sizes. Alternatively, sodium aluminum calcium silicates of nominal 3 μm in diameter can also be used (such as Mizusawa Silton® JC-30), but other suitable spherical inorganic antiblocks can be used including polymethylmethacrylate, silicas, and silicates, and ranging in size from about 2 μm to 6 μm. It is often preferred to discharge-treat the exposed side of this layer to enable adequate adhesion and wet-out of the inventive coatings to this side.

In the embodiment of applying a coextruded layer of EVOH or PVOH as the metal receiving layer, this layer may be directly coextruded with the PLA-including core layer such that the extruded EVOH or PVOH layer is directly contiguous with the core layer. It may also be considered to add antiblocking agents as described previously to this metal receiving layer to aid in machinability and film handling. Suitable antiblock additive amounts, types, and sizes are as described in the previous paragraph.

The coextrusion process can include a multi-layered compositing die, such as a two-, three-, or four-layer die (or more). In the case of a 2-layer coextruded film embodiment, a two-layer compositing die can be used. One embodiment as described previously is to coextrude two layers including an EVOH or PVOH resin-containing layer and a PLA resin-containing core layer.

In the case of a 3-layer coextruded film, a 3-layer compositing die can be used whereby a PLA resin-containing core layer can be sandwiched between a heat sealable amorphous PLA resin layer and the EVOH or PVOH resin-containing layer, which is also the metal-receiving layer.

In the case of the three-layer coextruded film embodiment above, the first EVOH or PVOH resin-containing layer coextruded on one side of the PLA core layer is the metal-receiving layer; the skin layer coextruded on the opposite side of the PLA core layer may be a heat sealable resin layer. Both the first EVOH or PVOH coextruded resin-containing layer and the heat sealable skin layer preferably have a thickness after biaxial orientation between 0.5 and 5 μm, preferably between 0.5 and 3 μm, and more preferably between 1.0 and 2.0 μm.

The extrusion grade EVOH can be of any suitable grade. In particular, those grades available from Nippon Gohsei and Kuraray are preferred such as: Nippon Gohsei Soarnol® SG645B EVOH grade, 38 mol % ethylene content, melt index 3.5 g/10 minutes at 210° C., density 1.16 g/cm$^3$, melting point 130-200° C.; Kuraray Evalca® EVOH grade G176, 48 mol % ethylene content, melt index 15.0 g/10 minutes at 210° C., density 1.12 g/cm$^3$, melting point 160° C.; Kuraray Evalca® EVOH grade E105, 44 mol % ethylene content, melt index 13.0 g/10 minutes at 210° C., density 1.14 g/cm$^3$, melting point 165° C.; Kuraray Evalca® EVOH grade H171, 38 mol % ethylene content, melt index 3.4 g/10 minutes at 210° C., density 1.17 g/cm$^3$, melting point 172° C.; Kuraray Evalca® EVOH grade C109, 35 mol % ethylene content, melt index 21.0 g/10 minutes at 210° C., density 1.17 g/cm$^3$, melting point 177° C.; Kuraray Evalca® EVOH grade F171, 32 mol % ethylene content, melt index 3.7 g/10 minutes at 210° C., density 1.19 g/cm$^3$, melting point 183° C.; Kuraray Evalca® EVOH grade J102, 32 mol % ethylene content, melt index 3.9 g/10 minutes at 210° C., density 1.17 g/cm$^3$, melting point 183° C.; and Kuraray Evalca® EVOH grade L104, 27 mol % ethylene content, melt index 8.9 g/10 minutes at 210° C., density 1.20 g/cm$^3$, melting point 191° C.

If one uses those extrusion grade EVOHs which are comprised of 38 mol % ethylene content or higher (e.g. 44 mol %, 48 mol %), these will have a better ability to transversely orient at higher orientation rates such as 6-10 times. Lower ethylene content EVOH can also be used (e.g. 35 mol %, 32 mol %, 27 mol %) but generally may be limited to lower transverse orientation rates such as 3-5 times to prevent or minimize cracking of the EVOH layer. In terms of better barrier properties and degradability, it may be preferred to use those EVOH grades that have a lower ethylene content of 27-38 mol %.

Because of the relatively higher amounts of ethylene content in these extrusion-grade EVOH resins, the degradation or compostability of such EVOH may be very slow or not obtainable, particularly in comparison to PLA resins. When these extrusion-grade EVOHs are coextruded with PLA layers, the overall degradability or compostability of the entire film may be retarded or slower such that the film laminate may not degrade in time to meet recognized industry standards for compostable or degradable plastics. To improve the degradability of these EVOH coextrusions, it is optionally possible to add additives to the EVOH that help catalyze or break-down the EVOH layer in composting mediums. For extrusion-grade or solution-grade PVOH, however, PVOH generally remains water-soluble and can be relatively easily broken-down and metabolized by microbes with no need for pro-degradants or decomposition accelerators.

Commercially available additives for accelerating degradation ("pro-degradants") can be obtained from EPI Environmental Products Inc. and Ecologic, LLC. EPI's oxo-degradable additives are typically based on proprietary transition-metal compounds, which can catalytically break down polyolefins upon exposure to heat, light, and moisture. Without being bound by any theory, free radicals are produced from the catalytic reaction of the transition metal, light (UV), heat, and the polyolefin chains, and these radicals continue to break down other polymer chains in a self-perpetuating sequence. Eventually, the polymer chains are broken down into small enough segments such that microbes can metabolize them and render them into waste gases. Ecologic uses a proprietary blend of organic compounds (tradename Ecopure®) which—when added to a polymeric material—makes the hydrophobic polymer more hydrophilic. Without being bound by any theory, in a composting medium with heat and moisture, this increased hygroscopic polymer surface allows microbes to form a biofilm whereby the microbes can attack the polymer chain ends and eventually break-down the polymer chain into smaller oligomers, allowing metabolization into waste gases like methane and carbon dioxide. Ecologic has a family of products that can be formulated specifically for polyolefins, nylons, polyesters, and EVOH. Preferred pro-degradants would be the speciallized product for EVOH from Ecologic. This Ecopure® version based on EVOH carrier resin is available as a masterbatch grade EV03. Typical loading of this masterbatch into the EVOH coextruded skin layer is at about 0.5-3 wt % of the EVOH layer, preferably 1-2 wt %.

If extrusion-grade PVOH is used, a suitable one is obtainable from Nippon Gohsei under their Nichigo® tradename. In particular, grade G-polymer™ OKS-8049P is suitable, having a melt index of 3.5 g/10 minutes at 210° C., density of 1.2-1.3, and melting point of 185° C.

As the metal receiving layer in these embodiments, the extrusion-grade EVOH or PVOH may also be formulated with an amount of antiblocking agent to aid in film-handling, winding, COF control, etc. Suitable amounts would be about 100-1000 ppm of this layer, preferably about 300-500 ppm. Preferred types of antiblock are spherical crosslinked silicone polymer such as Momentive's Tospearl® grades of polymethylsilsesquioxane of nominal 2.0 and 3.0 μm sizes. Alternatively, sodium aluminum calcium silicates of nominal 2 or 3 μm in diameter can also be used (such as Mizusawa Silton® JC-20 or JC-30 respectively), but other suitable spherical inorganic antiblocks can be used including polymethylmethacrylate, silicas, and silicates, and ranging in size from about 2 μm to 6 μm. It is also often preferred to discharge-treat the exposed side of this layer to enable adequate adhesion and nucleation of the metal deposition to this side. The EVOH or PVOH coextruded PLA film is wound up into roll form and can be metallized by placing it in a vacuum deposition metallizing chamber and vapor-deposited with aluminum upon the EVOH or PVOH layer's surface at an optical density of about 1.5-5.0, preferably, 2.2-2.8.

An optional ingredient, which can be added to either the PLA-containing core layer or the vinyl alcohol polymer metal receiving layer, or to both layers, is a tie-resin or compatibilizer to improve inter-layer bonding between the EVOH or PVOH coextruded skin layer and the PLA core layer. Additionally, a further option can be to co-extrude a tie-resin layer as a discrete layer interposed between the PLA core layer and the EVOH or PVOH metal receiving layer. These tie-resins can be those produced by: Arkema under the Lotader® tradename which are ethylene-acrylic-maleic anhydride copolymers such as grades 4210 or 3210; DuPont under the Biomax® tradename such as grade 120 ethylene-methacrylate copolymer; maleic anhydride grafted LLDPE from Lyondell Chemical Company Plexar® PX5400×01; MSI Technology NBX007-54 adhesive resin for bonding PLA to polyolefins; or acrylic and maleic anhydride modified ethylene copolymer like Mitsui Chemical Admer® SF600. If blended into the core layer or metal receiving layer (or both), suitable amounts can range from 1-20 wt % of the layer, preferably 2-5 wt %.

In the embodiments in which a coating solution of EVOH or PVOH is used, a suitable PLA-including substrate film is used to receive the coating. If a three-layer coextruded film substrate embodiment is chosen, a first PLA resin-containing skin layer is coextruded on one side of the PLA core layer as the coating-receiving layer; a PLA-including skin layer coextruded on the opposite side of the PLA core layer may be a heat sealable resin layer. Both the first PLA resin-containing coating receiving layer and the PLA heat sealable skin layer preferably have a thickness after biaxial orientation between 0.5 and 5 μm, preferably between 0.5 and 3 μm, and more preferably between 1.0 and 2.0 μm.

The EVOH or PVOH coating of interest may be applied in two methods: Via in-line coating between the two sequential steps of machine and transverse direction orientation; or via off-line coating wherein the coating is applied on an already formed biaxially oriented film. In this latter case, a BOPLA substrate film can be made as described above—without the in-line coating steps—and wound into roll form. This uncoated film can then be processed in a separate off-line coater where the coating can be applied in various ways known in the art via gravure roll or metering rod, preferably gravure. Alternatively, biaxially oriented PLA film can be obtained commercially from Bi-Ax International Inc. under the tradename Evlon®. Evlon® is a biaxially oriented polylactide film where one side is heat sealable. The film has about a 20 μm thickness, a yield of about 40.3 $m^2/kg$, a machine direction tensile strength of about 62 $N/mm^2$, and a transverse direction tensile strength of 103 about $N/mm^2$. These coatings are applied to the coating receiving side of the film opposite the heat sealable layer. The coating receiving layer may be discharge-treated or not, but preferably discharge-treated to a dyne level of at least about 38 dynes/cm. The coated film is dried in an air flotation oven and wound back up into roll form. The film roll is then placed in a vacuum deposition metallizing chamber and metallized with aluminum at an optical density of about 1.5-5.0, preferably, 2.2-2.8.

A suitable coating for the PLA substrate films, which has been found to improve significantly moisture barrier properties, is solution-grade EVOH, PVOH, or blends thereof. Suitable materials are: Kuraray Exceval® RS-117 EVOH, Celanese Celvol® 24-203, Celvol® 103, Celvol® 125 or Celvol® 502 PVOH, plus a small amount of defoamer, preferably Air Products Surfynol 420 (typically about 0.10 wt % NVS (non-volatile solids) of the coating solution). This formulation can be applied in-line via a reverse gravure roll coating process onto the desired coating receiving layer side of the PLA film coextrusion or applied off-line onto an already formed PLA film substrate. A preferred embodiment is to apply the coating via an off-line coater using reverse gravure roll.

It can also be optionally considered to crosslink these coatings using a crosslinker such as Emerald Performance Materials Freechem® 40 DL glyoxal or Hercules Polycup 172 epichlorohydrin. Crosslinking of the vinyl alcohol polymers can be desirable for further improved gas barrier properties and adhesion to the substrate. However, crosslinking of the coating can present more problems in attempts to recycle such coated films back into new film production. U.S. patent application Ser. No. 12/890,349 describes such crosslinked coatings and is incorporated in its entirety by reference.

It is also preferable to discharge-treat the coating receiving side of the PLA film coextrusion prior to coating to ensure adequate wet-out of the coating onto the substrate. (However, the surface energy of PLA is high enough that this step could be skipped, but to ensure best coating laydown, it is preferred to discharge-treat the substrate prior to coating via any of several methods such as electrical corona discharge, flame treatment, or other discharge treatment methods.)

Exceval® RS-117 is a fully hydrolyzed EVOH powder with a viscosity of about 23-30 mPa-sec, a degree of hydrolysis of about 97.5-99.0%, a maximum ash content of about 0.4%, a maximum volatile content of about 0.5%, molecular weight $M_w$ of about 130,000 g/molm and $M_n$ of about 53,000 g/mol. Celvol® 24-203 is a partially hydrolyzed PVOH solution at about 23% wt non-volatile solids (NVS), with about 88.00+/−1.00 mol-% hydrolysis, a 4 wt % solids solution, a viscosity of about 4.00+/−0.50 cP, containing total volatiles of about 5.00 wt % maximum, a methanol maximum of about 0.90 wt %, an ash maximum of about 0.90 wt %, and a 4 wt % solution pH of about 5.50+/−1.00. Celvol® 103 is a partially hydrolyzed PVOH solution at about 23% wt non-volatile solids (NVS), with about 88.00+/−1.00 mol-% hydrolysis, a 4 wt % solids solution, a viscosity of about 4.00+/−0.50 cP, containing total volatiles of about 5.00 wt % maximum, a methanol maximum about 0.90 wt %, an ash maximum of about 0.90 wt %, and a 4 wt % solution pH of about 5.50+/−1.00. Celvol® 125 is a super hydrolyzed PVOH solution with about 99.65+/−0.35 mol-% hydrolysis, a 4 wt % solids solution with viscosity of about 30.00+/−2.00 cP, containing total volatiles of about 5.00 wt % maximum, a methanol maximum of about 0.90 wt %, an ash maximum of about 1.20 wt %, and a 4 wt % solution pH of about 6.50+/−1.00. Celvol® 502 is a partially hydrolyzed PVOH solution with about 88.00+/−1.00 mol-% hydrolysis and a 4 wt % solids solution with a viscosity of about 3.35+/−0.35 cP. The Surfynol 420 defoamer has ethylene oxide content of about 1.3 mol % or about 20 wt %, specific gravity at 25° C. of about 0.943, pH in a 1% aqueous solution of about 6-8, viscosity at 20° C. is <250 cps, hydrophile-lipophile balance is about 4, and volatile organic compound content of (VOC, EPA method 24) about 28 wt %.

The Exceval® EVOH comes in solid form and needs to be dissolved in water (tap water can be used) in a vessel slowly heated to 90-95° C., while being stirred, and cooled slowly back to room temperature. EVOH solutions of about 5-12% wt NVS were made, preferably about 10% wt NVS. The Celanese PVOH can be obtained as either already prepared aqueous solutions of nominal 23% wt NVS (e.g. Celvol 24-203) or as a solid powder (e.g. Celvol 103). If the latter, the PVOH powder is dissolved in water, heated slowly to 85-95° C., while being stirred, and cooled slowly back to room temperature. Different % solids solutions can be made as desired, ranging from about 12-16% wt NVS.

If desired to crosslink the coating, Emerald Performance Materials Freechem® 40 DL glyoxal or Hercules Polycup 172 epichlorohydrin was added to the PVOH or EVOH solution or blends just prior to coating in order to prevent premature crosslinking. The Polycup 172 is a polyamide-epichlorohydrin crosslinker with about 12-12.5% wt NVS, viscosity at 25° C. of about 25-75 cps, a pH of about 4.0-5.5, and specific gravity at 21° C. of about 1.03. Freechem® is a glyoxal crosslinker composed of ethanedial with about 40 wt % NVS, less than about 0.8 wt % residual acid, a pH of about 3.0, a specific gravity of about 1.270, a boiling point of about 110° C., and a melting point of about 15° C. Preferably, the Freechem® glyoxal crosslinker is used. Crosslinker (e.g. glyoxal) amount ranged from about 0.4-2.0 NVS wt %; preferably about 0.5-1.5.

Blends of EVOH and PVOH coating solutions can also be used. Preferred blend ratios of the PVOH and EVOH components ranged from about 0.40-10.5 wt % non-volatile solids (NVS) and about 3.0-9.0 wt % NVS, respectively. More preferably, PVOH NVS wt % was about 1.0-8.0 and EVOH NVS wt % was about 3.5-6.5. If crosslinker (e.g. glyoxal) is used, the amount ranged from about 0.4-2.0 NVS wt %; preferably about 0.5-1.5. Total NVS wt % of the blend ranged from about 4-21; preferably, total NVS wt % was 6.0-15.0. Going above 15.0 NVS wt % can result in severe foaming issues during coating; this can be mitigated in part by heating the coating to 120° F. (49° C.), but foaming at these higher NVS wt % can occur readily and will affect ability to achieve consistent coating uniformity and quality. The final thickness of the dried PVOH/EVOH blend on the substrate was about 0.10 µm-0.40 µm, preferably between about 0.125-0.375 µm, and more preferably between about 0.1875-0.25 µm.

If coating is applied in-line with PLA film orientation, the coated side was then dried in the transverse direction preheating oven zones prior to transverse direction stretching. After transverse stretching, the film was heat-set to minimize shrinkage. If coating is applied off-line on an already-formed PLA substrate, the coating is dried in an air flotation oven at drying temperatures such that the coating is fully dried and crosslinked and the PLA substrate film experiences minimal thermal shrinkage. The thickness of the PVOH or EVOH coating on the BOPLA film ranged between about 0.005-0.015 mil (0.125-0.375 µm), preferably about 0.0075-0.010 mil (0.1875-0.25 µm) thick after drying. The film was wound in roll form. The film roll was then placed in a vacuum deposition metallizing chamber and metallized with aluminum at an optical density of about 1.5-5.0, and preferably, 2.2-2.8. Other metals can also be used besides aluminum, such as copper, gold, zinc, titanium, chromium, vanadium, maganese, iron, cobalt, nickel, palladium, or alloys or blends thereof. Preferably, aluminum is used for cost effectiveness.

As a basefilm for metallization, the above embodiments using coextruded or coated EVOH or PVOH layers were placed inside a vacuum chamber metallizer for vapor deposition metallization using aluminum at an optical density of about 1.5-5.0, preferably about 2.2-2.8, and more preferably about 2.4 upon the EVOH or PVOH layer's surface. Optionally but preferably, prior to aluminum deposition, the EVOH or PVOH layer's surface is treated using a type of sputtering with a copper or titanium cathode, preferably copper. This treater is typically set up in the low vacuum section of the metallizer where the unwinding roll is located and the film is passed through this treater prior to entering the high vacuum section of the metallizer where the evaporation boats are located. The treater uses high voltage between the anode and cathode to produce free electrons. Oxygen gas, argon gas, nitrogen gas, or blends thereof—preferably nitrogen gas—is introduced into the treater and the free electrons combine with the gas to produce ions. Magnetic fields guide and accelerate the ions onto the copper cathode target, which then emit copper ions. These copper ions are deposited onto the polylactic acid polymer substrate, creating a monolayer of copper, ca. 20-2000 ng/m$^2$ (nanogram/sq. meter) thick. This method of applying a "primer" layer of copper or other metals prior to aluminum deposition, has been found to be efficacious in improving further gas barrier and metal adhesion properties. Aluminum metal is then vapor-deposited upon this "primer" layer as described previously. U.S. patent application Ser. No. 12/542,428 that describes this process is wholly incorporated by reference.

EXAMPLES AND COMPARATIVE EXAMPLES

This invention will be better understood with reference to the following examples, which are intended to illustrate specific embodiments within the overall scope of the invention.

Comparative Example 1 (CEx. 1)

Multi-layer coextruded BOPLA film was made using a 1.5 m wide pilot line sequential orientation process with about 100 wt % Natureworks® PLA4032D crystalline PLA as the core layer (2); a coextruded heat sealable layer (3) comprising of substantially Natureworks® PLA4060D amorphous PLA upon one side of the core layer (2); and the metal receiving layer (1) of about 100 wt % Natureworks® PLA4032D was coextruded upon the side of the core layer (2) opposite the sealant layer (3), via coextrusion through a die. An amount of antiblock was incorporated into the skin layers (1) and (3) for web handling. The antiblock used was Mizusawa Silton® JC-30 or JC-20, which were made into respective masterbatches using PLA resin as a carrier resin. The metal receiving layer (1) used Silton® JC-20 nominal 2.0 µm spherical sodium calcium aluminum silicate; for the amorphous PLA heat sealable layer, Silton® JC-30 3.0 µm spherical sodium calcium aluminum silicate was used. The antiblock loading was about 300 ppm in the metal receiving layer (1); and about 1500 ppm in the heat sealable amorphous PLA layer (3).

The coextruded film was cast onto a chill drum using an electrostatic pinner, oriented in the machine direction through a series of heated and differentially sped rolls, followed by transverse direction stretching in a tenter oven. The multi-layer coextruded laminate sheet is coextruded at processing temperatures of ca. 190° C. to 205° C. through a die and cast onto a cooling drum whose surface temperature is controlled between about 15° C. and 26° C. to solidify the non-oriented laminate sheet at a casting speed of about 13 mpm. The non-oriented laminate sheet is stretched in the longitudinal direction at about 60° C. to 70° C. at a stretching ratio of about 3 times the original length and the resulting stretched sheet is annealed or heat-set at about 45° C. to 50° C. to obtain a uniaxially oriented laminate sheet. The uniaxially oriented laminate sheet is introduced into a tenter at a linespeed of ca. 35 to 40 mpm and preliminarily heated between about 65° C. and 75° C., and stretched in the transverse direction at about 75° C. to 95° C. at a stretching ratio of about 5 times the original length and then heat-set or annealed at about 100° C. to 120° C. to reduce internal stresses due to the orientation and minimize shrinkage and give a relatively thermally stable biaxially oriented sheet.

After biaxial orientation, the thickness of the coextruded film overall was nominal 80G (20 µm); the metal receiving layer (1) was nominal 6G (1.5 µm); the sealant layer (3) was nominal 6G (1.5 µm); and the core layer (2) was nominal 68G (17.0 µm). The film was heat-set or annealed in the final zone of the tenter oven to reduce internal stresses and minimize heat shrinkage of the film and maintain a dimensionally stable biaxially oriented film. The side of the metal receiving layer opposite the core layer was treated via corona discharge treatment method after orientation. The BOPLA multi-layer film was wound in roll form for further processing such as metallizing upon the discharge-treated surface.

The film roll was then placed in vacuum metallizer for vapor deposition of aluminum upon the coated surface. The metal layer optical density was about 2.2-3.2, preferably about 2.4. The surface of the metal-receiving layer was "pre-treated" or "primed" prior to aluminum deposition within the metallizing vacuum chamber, using a glow discharge sputtering process as described previously, using a copper cathode target at a voltage of about 401.62 v and using nitrogen gas at a flow rate of about 1.5 liter/min. After deposition of this copper primer layer upon the metal-receiving layer's surface, this primed substrate was followed by vapor deposition of aluminum to a nominal optical density target of 2.4. Metallizing linespeed was about 305 mpm. The metallized roll was then slit on a film slitter and tested for properties.

Example 1 (Ex. 1)

Comparative Example 1 was substantially repeated except that the metal receiving layer was changed to about 100 wt % extrusion-grade EVOH Soarnal® SG654B, 38 mol % ethylene content. The coextruder heater setpoints for this EVOH layer was changed to about 204-210° C.

Example 2 (Ex. 2)

Example 1 was substantially repeated except that the metal receiving layer was changed to a blend of about 96 wt % EVOH SG645B and 4 wt % Biomax® 120 ethylene-methacrylate copolymer as a tie-resin to improve interlayer bonding between the EVOH-including metal receiving layer and the PLA-including core layer.

Example 3 (Ex. 3)

Example 2 was substantially repeated except that the PLA-including core layer was changed to a blend of about 96 wt % 4032D crystalline PLA with about 4 wt % Biomax® 120 ethylene-methacrylate copolymer. Ex. 3 was to test a structure using a tie-resin in both the PLA-including core layer as well as the EVOH-including metal receiving layer.

Example 4 (Ex. 4)

Example 1 was substantially repeated except that the metal receiving layer was changed to about 100 wt % extrusion-grade PVOH Nichigo® OKS-8049P.

Example 5 (Ex. 5)

Example 4 was substantially repeated except that both the PVOH-including metal receiving layer and the PLA-including core layer were blended with about 4 wt % Admer® SF600 acrylic and maleic anhydride modified ethylene copolymer of each respective layer.

Example 6 (Ex. 6)

In this example, Bi-Ax International's commercially available Evlon® BOPLA film, nominal 20 µm thick, one side heat sealable, one side discharge-treated, was used as the PLA film substrate. The coating receiving layer was the discharge-treated side of the film (non-heat sealable side) and had a dyne level of about 38-44 dyne-cm/cm.

A roll of the BOPLA film was mounted on the unwind stand of an off-line solution coater, about 65 inches (ca. 1.65 m) width. The treated side of the PLA film was coated with an aqueous coating formulation of EVOH Exceval® RS-2117 grade of about 10.08 wt % NVS with about 0.050 wt % NVS Surfynol® 420 defoamer added, for a total NVS of about 10.13 wt %. Coating application was done using a 200 line screen rotoflow Quad gravure cylinder in a reverse-gravure open-pan applicator with 64¾ inch (1645 mm) backing roll. Coating speed was about 400-600 fpm (ca. 122-183 mpm), preferably about 550 fpm (168 mpm). The coated film was dried in an 3-zone air flotation oven at about 170-190° F. (ca. 76-88° C.), such that any thermal shrinkage of the BOPLA film was kept to a minimum (e.g. less than 0.5% shrinkage, and preferably none). After drying, the coated PLA film was wound into roll form for metallizing. The dried coating thickness was about 0.15-0.35 μm in thickness, preferably about 0.20-0.25 μm thickness.

The total % NVS of the aqueous coating solutions of interest is from about 3-30 wt %, preferably about 10-15 wt %, with a viscosity of less than 200 cps, preferably about 100-200 cps. The higher the percent non-volatile solids, the more cost-effective the coating is as less water needs to be driven off. However, the higher the % solids become, the more viscous the coating becomes, and the more difficult it may become to process due to foaming, slinging, etc. The coating may optionally be heated to about 120° F. (49° C.) to further aid lowering the coating viscosity and reducing foaming tendency.

Example 8 (Ex. 8)

Example 1 was substantially repeated except that the metal receiving layer was changed to a blend of 99 wt % SG654B EVOH and 1 wt % of Ecopure® EVOH-based masterbatch EV03. The use of the Ecopure® material was to assess improved degradation of the laminate film and gas barrier properties.

The metallized Examples and Comparative Examples were then tested for appearance and barrier properties, and when applicable, coating and metal adhesion. The following Table 1 summarizes the various Examples and Comparative Examples:

TABLE 1

| Sample | Metal Receiving Layer (A) Composition | | Coating Receiving Layer Composition | Core Layer (B) Composition | | Metal Receiving Layer (A) nom. thickness (um) | Metall. O2TR cc/m$^2$/day | Metall. MVTR g/m$^2$/day |
|---|---|---|---|---|---|---|---|---|
| Ex. 1 | EVOH SG 645B 100 wt % | — | NA | PLA 4032D 100 wt % | — | 1.5 | 0.53 | 0.29 |
| Ex. 2 | EVOH SG 645B 96 wt % | Tie Resin Biomax 120 4 wt % | NA | PLA 4032D 100 wt % | — | 1.5 | 0.13 | 0.54 |
| Ex. 3 | EVOH SG 645B 96 wt % | Tie Resin Biomax 120 4 wt % | NA | PLA 4032D 96 wt % | Tie Resin Biomax 120 4 wt % | 1.5 | 0.11 | 0.36 |
| Ex. 4 | PVOH OKS-8049P 100 wt % | — | NA | PLA 4032D 100 wt % | — | 1.5 | 0.37 | 0.37 |
| Ex. 5 | PVOH OKS-8049P 96 wt % | Tie Resin Admer SF600 4 wt % | NA | PLA 4032D 96 wt % | Tie Resin Admer SF600 4 wt % | 1.5 | 0.31 | 0.45 |
| Ex. 6 | EVOH RS-2117 100 wt % | — | PLA 4032D 100 wt % | PLA 4032D 100 wt % | — | 0.25 | 0.16 | 0.31 |
| Ex. 7 | PVOH Celvol 103 100 wt % | — | PLA 4032D 100 wt % | PLA 4032D 100 wt % | — | 0.22 | 0.25 | 0.85 |
| Ex. 8 | EVOH SG 645B 99 wt % | Pro-degradant EV03 1 wt % | NA | PLA 4032D 100 wt % | — | 1.5 | 0.46 | 0.37 |
| CEx. 1 | PLA 4032D 100 wt % | — | NA | PLA 4032D 100 wt % | — | 1.5 | 17.67 | 4.50 |

The coated film roll was then placed in a vacuum metallizer for vapor deposition of aluminum upon the coated surface. The metal layer optical density was about 2.2-3.2, preferably about 2.4. The surface of the metal-receiving coated layer was "pre-treated" or "primed" prior to aluminum deposition within the metallizing vacuum chamber, using a glow discharge sputtering process as described previously, using a copper cathode target at a voltage of about 401.62 v and using nitrogen gas at a flow rate of about 1.5 liter/min. After deposition of this copper primer layer upon the coated surface, this primed substrate was followed by vapor deposition of aluminum to a nominal optical density target of 2.4. Metallizing linespeed was about 305 mpm. The metallized rolls were then slit on a film slitter and tested for properties.

Example 7 (Ex. 7)

Example 6 was substantially repeated except that the coating was changed from EVOH to PVOH; using Celvol® 103 fully hydrolyzed PVOH. The PVOH aqueous solution was about 11.23 wt % NVS with about 0.050 wt % Surfynol® 420 defoamer added, for a total NVS of about 11.28 wt %.

As Table 1 shows, Comparative Example 1 (CEx 1), which is a control film using metallized BOPLA substrate film without any modified metal-receiving layer, had MVTR barrier that was 4.50 g/m$^2$/day and O$_2$TR barrier of 17.67 cc/m$^2$/day. This value is fairly typical for metallized BOPLA film. This moisture barrier performance, however, is not suitable for packaging products that require high moisture barrier properties.

Examples 1 to 3 (Ex. 1-Ex. 3) used extrusion-grade EVOH (Nippon Gohsei Soarnal® SG654B 38 mol % ethylene) as the metal receiving layer coextruded with Natureworks 4032D PLA as the core layer. Examples 2 and 3 contained an amount of Biomax® 120 as a tie-resin to help improve bonding between the EVOH skin layer and the PLA core layer. Ex. 2 used Biomax®120 blended in with the EVOH skin layer only; Ex. 3 used the tie-resin blended in both the EVOH skin layer and the PLA core layer. The EVOH skin layer was subsequently metallized via vapor deposition of aluminum. As Table 1 shows, these Examples show a substantial improvement in both oxygen and moisture barrier properties compared to CEx.1.

Examples 4 and 5 (Ex. 4, Ex. 5) used extrusion-grade PVOH (Nippon Gohsei Nichigo® OKS-8049P as the metal receiving layer coextruded with Natureworks 4023D PLA as the core layer. Ex. 5 also used an amount of tie-resin (Admer® SF600) blended in both the EVOH skin layer and PLA core layer. The PVOH skin layer was subsequently metallized via vapor deposition of aluminum. These Examples show a substantial improvement in both oxygen and moisture barrier properties compared to CEx.1.

Examples 6 and 7 (Ex. 6, Ex. 7) used, respectively, an aqueous coating of EVOH or PVOH solution-coated and dried upon a BOPLA substrate. In the case of an EVOH coating, Exceval® RS-2117 was used; in the case of a PVOH coating, Celvol® 103 was used. The dried coating surface was subsequently metallized via vapor deposition of aluminum. These Examples showed a substantial improvement in oxygen and moisture barrier property when compared to CEx. 1.

Example 8 (Ex. 8) used extrusion-grade EVOH as the skin metal receiving layer and coextruded with PLA core layer as in Example 1, but included an amount of Ecopure® EV03 additive in the EVOH skin to promote degradation properties of this layer. Oxygen and moisture barrier properties of Ex. 8 continued to be substantially improved over CEx. 1, so it appears this amount of pro-degradant did not significantly affect gas barrier properties. Moreover, based on compostability testing, the addition of the EV03 in Ex. 8 helped improve compostability/degradability compared to CEx. 1 (all PLA film structure) and Ex. 1 (EVOH/PLA coextrusion without pro-degradant), such that the time frame for complete degradation of Ex. 8 is nearly the same as CEx. 1.

Figure 1B:
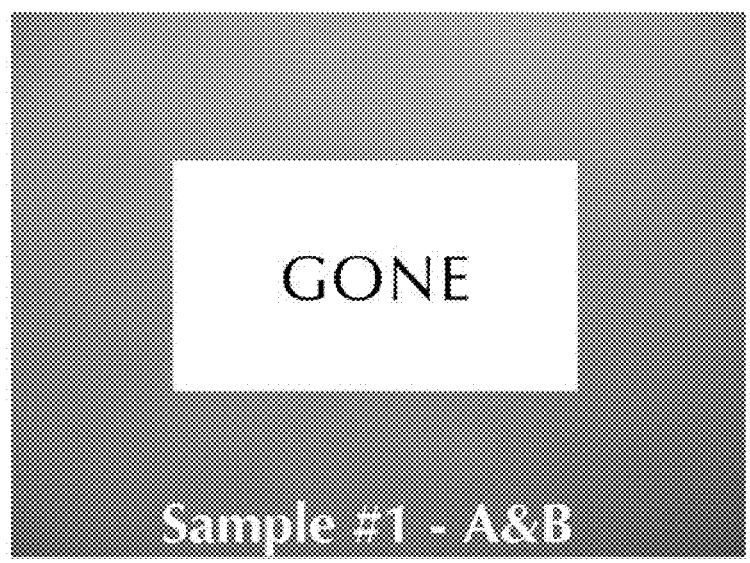
FIG. 1B is a photograph showing that the control PLA film of CEx. 1 is completely gone after 15 weeks of exposure to the conditions outlined in ASTM D6400.
Figure 2A:
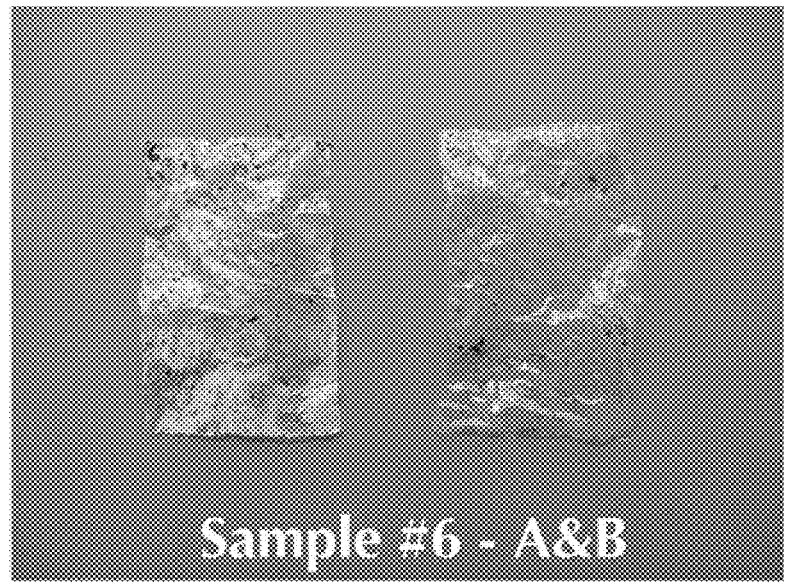
FIG. 2A is a photograph of the film of Ex. 8 after 3 weeks of exposure to the conditions outlined in ASTM D6400.
Figure 2B:
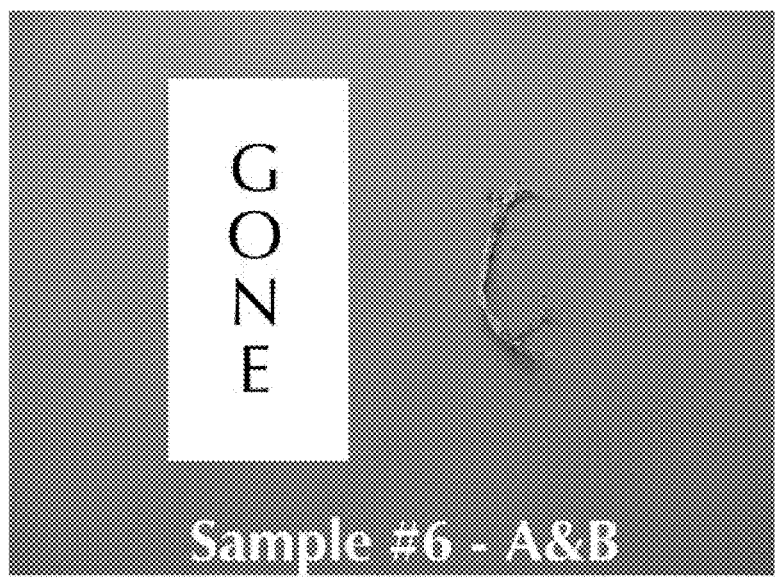
FIG. 2B is a photograph showing that the film of Ex. 8 is nearly completely gone after 15 weeks of exposure to the conditions outlined in ASTM D6400.
Figure 3A:
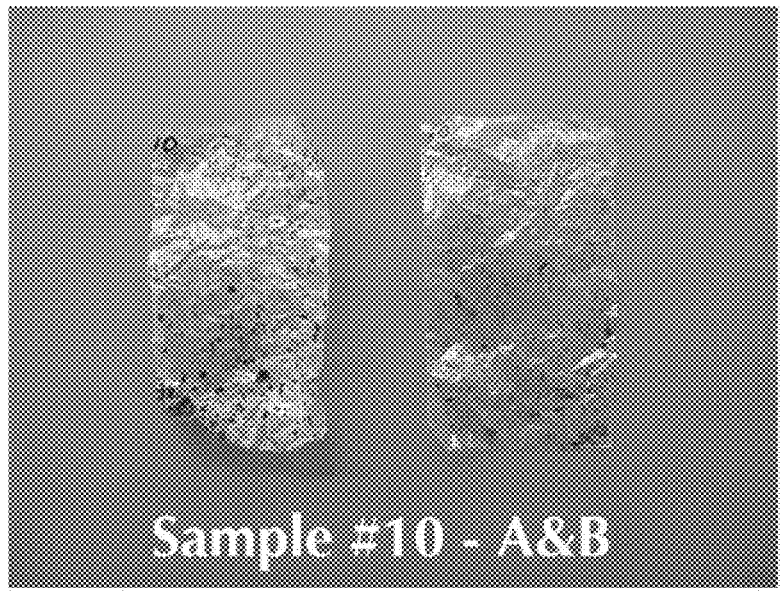
FIG. 3A is a photograph of the EVOH/PLA coextrusion film of Ex. 1 after 3 weeks of exposure to the conditions outlined in ASTM D6400.
Figure 3B:
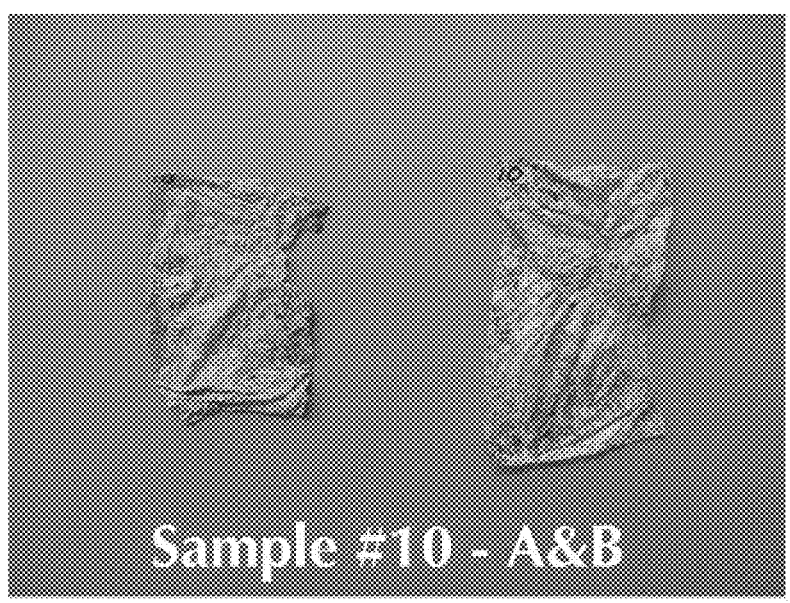
FIG. 3B is a photograph showing little significant degradation of the EVOH/PLA coextrusion film of Ex. 1 after 15 weeks of exposure to the conditions outlined in ASTM D6400.

FIGS. 1a, 1b, 2a, 2b, 3a and 3b illustrate the degradation comparison of CEx. 1, Ex. 8, and Ex. 1, respectively. FIG. 1a is a photograph of the control PLA film of CEx. 1 after 3 weeks of exposure to the conditions outlined in ASTM D6400. FIG. 1b shows the control PLA film of CEx. 1, degraded completely within 15 weeks in a composting medium. FIG. 3a is a photograph of the EVOH/PLA coextrusion film of Ex. 1 after 3 weeks of exposure to the conditions outlined in ASTM D6400. FIG. 3 shows that the EVOH/PLA coextrusion film of Ex. 1 did not have significant degradation after 15 weeks in a composting medium (however, after 26 weeks—the duration of the composting test—this sample could degrade completely). FIG. 2 shows that with the addition of the Ecopure® pro-degradant into the EVOH layer, Ex. 8 degraded nearly completely after 15 weeks in a composting medium, similar to CEx. 1.

Thus, there has been found a solution to provide significantly improved gas barrier films made by applying a metal receiving layer including EVOH or PVOH to a BOPLA substrate via coextrusion with PLA core layer or with coating of the EVOH or PVOH on a PLA layer. The use of these layers provides a surprisingly significant improvement in moisture barrier, particularly after metallizing, over unmodified metallized BOPLA films. Indeed, these results are even more unexpected considering that the vinyl alcohol polymers used are uncrosslinked and are polar, hygroscopic materials, which intrinsically are known to have poor moisture barrier properties.

Moreover, the degradability of these inventive BOPLA-based films can be maintained since the vinyl alcohol polymers are relatively thin compared to the overall PLA substrate thickness. The thin vinyl alcohol polymer layer tends to fragment and disappear along with the BOPLA substrate during the degradation period. Moreover, the vinyl alcohol polymers tend to be very hygroscopic which can aid in hydrolysis and decomposition during the composting process. This is probably very true for PVOH and the low ethylene content EVOH (coating grade). For EVOH with high ethylene content (extrusion-grade), the addition of a small amount of a pro-degradant can effectively improve degradation significantly without affecting gas barrier properties.

Test Methods

The various properties in the above examples were measured by the following methods:

Haze of the film was measured using a Gardner Instruments "Haze-Gard Plus" haze meter substantially in accordance with ASTM D1003. Desired haze value for a single sheet of film was 5% or less.

Moisture transmission rate of the film was measured by using a Mocon Permatran 3/31 unit substantially in accordance with ASTM F1249. A hand-lamination was made of the metallized PLA-based film using a transparent 80G (20 µm) PLA film (e.g. Bi-Ax International Evlon BOPLA film) with an acrylic-based pressure-sensitive adhesive adhered against the metal surface in order to protect the metallized film surface from handling damage. There is no limitation of the grade of the protective PLA film as far as the clear non-barrier PLA protective film itself has much higher MVTR ($>10$ g/m$^2$/day) or so. The pressure-sensitive adhesive side of the protective PLA film would be adhered to the metallized side of the example film with a rubber roller to eliminate air pockets, bubbles, and wrinkles. In general, preferred values of MVTR would be equal or less than 2.0 g/m$^2$/day, and preferably equal or less than 1.0 g/m$^2$/day, and even more preferably, equal or less than 0.5 g/m$^2$/day, at 38° C. and 90% relative humidity.

Oxygen transmission rate of the film was measured by using a Mocon Oxtran 2/20 unit substantially in accordance with ASTM D3985. A hand-lamination was made of the metallized PLA-based film using a transparent 80G (20 µm) PLA film (e.g. Bi-Ax International Evlon BOPLA film) with an acrylic-based pressure-sensitive adhesive adhered against the metal surface in order to protect the metallized film surface from handling damage. There is no limitation of the grade of the protective PLA film as far as the clear non-barrier PLA protective film itself has much higher MVTR ($>10$ g/m$^2$/day) or so. The pressure-sensitive adhesive side of the protective PLA film would be adhered to the metallized side of the example film with a rubber roller to eliminate air pockets, bubbles, and wrinkles. In general, preferred values of O$_2$TR would be equal or less than 46.5 cc/m$^2$/day at 23° C. and 0% relative humidity and preferably, less than 31.0 cc/m$^2$/day.

Appearance was rated qualitatively using a ranking system of 1-4, with 1 equating to very poor appearance and 4 equating to excellent appearance. 8½"×11" (21.6 cm×28 cm) cut sheet samples of the films were inspected by eye and rated as follows:

1=Large preponderance of defects
2=Some defects
3=Few defects
4=No visible defects In general, the preferred value for appearance was at least a 3 rating.

Wetting tension of the surfaces of interest was measured substantially in accordance with ASTM D2578-67. In general, the preferred value was equal to or greater than 38 dyne/cm.

Metal adhesion was measured by heat sealing on a SENTINAL Sealer model 12 ASL at 220° F. (104.4° C.) seal temperature, 15 second dwell, and 15 psi (103.42 kPa) seal jaw pressure, a piece of 1-mil (25 µm) thick Ethylene Acrylic Acid polymer film (EAA) to the metallized surface of a single sheet of metallized film and measuring the 180° peel strength of the metal from the substrate substantially in accordance with AIMCAL (Association of Industrial Metallizers, Coaters, and Laminators) test procedure TP-105-92. The test procedure and a kit of materials can be obtained from AIMCAL's website www.aimcal.com. The Metal Adhesion Test Kit is designed to permit testing using TP-105-92. The test kit contains 2 rolls of 3M™ tape #610, 2 rolls of EAA film and an AIMCAL Metallizing Technical Reference Manual. The test kit contains enough material to do at least 100 tests as described in the Technical Reference Manual, (TP-105-92). The test procedure used in testing the samples used in the examples of this application is described in AIMCAL Metallizing Technical Reference (Third Edition, © 2001). In general, acceptable values of metal adhesion was a minimum of 20 g/in (20 g/25 mm), and preferably about 50 g/in (50 g/25 mm) or higher.

Compostability or degradability of the test films was done substantially in accordance with ASTM D6400 for "Compostable Plastics" using a composting medium (e.g. mulch) and 58° C. composting temperature. In general, the film is desired to be visibly gone after the test duration of 26 weeks, and preferably within 15 weeks.

This application discloses several numerical ranges in the text and figures. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

The invention claimed is:

1. A laminate film comprising:
   a biaxially oriented first layer comprising polylactic acid (PLA), wherein the thickness of the first layer is 15-25 μm;
   a metal receiving second layer comprising uncrosslinked ethylene vinyl alcohol (EVOH) and a pro-degradant, wherein the second layer is co-extruded on a side of the first layer, wherein the thickness of the second layer is 1-2 μm; and
   a metal barrier layer on a side of the second layer opposite the PLA-containing layer;
   wherein the laminate film has a single barrier layer, wherein the metal barrier layer is the single barrier layer, and a moisture vapor transmission rate equal to or less than 0.37 g/m$^2$/day.

2. The laminate film of claim 1, wherein the metal layer is vapor deposited on the side of the second layer.

3. The laminate film of claim 1, wherein the metal layer comprises aluminum.

4. The laminate film of claim 1, wherein the metal layer has an optical density of 1.5-5.0.

5. The laminate film of claim 1, further comprising a non-contiguous primer metal layer between the second layer and the metal layer.

6. The laminate film of claim 5, wherein the non-contiguous primer metal layer comprises copper or titanium.

7. The laminate film of claim 1, wherein the first layer or the second layer further comprises a tie-resin.

8. The laminate film of claim 7, wherein the tie-resin comprises 0.5-10 wt. % of the first layer or the second layer.

9. A laminate film comprising:
   a biaxially oriented first layer comprising PLA, wherein the thickness of the first layer is 15-25 μm;
   a metal receiving second layer comprising: (i) a polymer chosen from the group consisting of uncrosslinked EVOH, uncrosslinked PVOH, and combinations of uncrosslinked EVOH and uncrosslinked PVOH; and (ii) a tie-resin, wherein the second layer is co-extruded on a side of the first layer, and wherein the thickness of the second layer is 1-2 μm; and
   a metal barrier layer on a side of the second layer opposite the PLA-containing layer;
   wherein the laminate film has a single barrier layer, wherein the metal barrier layer is the single barrier layer, and a moisture vapor transmission rate equal to or less than 0.37 g/m$^2$/day.

10. The laminate film of claim 9, wherein the second layer comprises EVOH and PVOH.

11. The laminate film of claim 9, wherein the second layer consists of a blend of EVOH and PVOH.

12. The laminate film of claim 9, wherein the metal layer is vapor deposited on the side of the second layer.

13. The laminate film of claim 9, wherein the metal layer comprises aluminum.

14. The laminate film of claim 9, wherein the metal layer has an optical density of 1.5-5.0.

15. The laminate film of claim 9, further comprising a non-contiguous primer metal layer between the second layer and the metal layer.

16. The laminate film of claim 15, wherein the non-contiguous primer metal layer comprises copper or titanium.

17. The laminate film of claim 9, wherein the first layer further comprises a tie-resin.

18. The laminate film of claim 17, wherein the tie-resin comprises 0.5-10 wt. % of the first layer.

19. The laminate film of claim 9, wherein the tie-resin comprises 0.5-10 wt. % of the second layer.

* * * * *